(12) United States Patent
Yamazaki et al.

(10) Patent No.: US 9,034,675 B2
(45) Date of Patent: May 19, 2015

(54) LIGHT-EMITTING DEVICE AND METHOD FOR MANUFACTURING LIGHT-EMITTING DEVICE

(71) Applicant: Semiconductor Energy Laboratory Co., Ltd., Atsugi-shi, Kanagawa-ken (JP)

(72) Inventors: Shunpei Yamazaki, Tokyo (JP); Kengo Akimoto, Kanagawa (JP); Junichiro Sakata, Kanagawa (JP); Yoshiharu Hirakata, Kanagawa (JP); Norihito Sone, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/299,045

(22) Filed: Jun. 9, 2014

(65) Prior Publication Data

US 2014/0287546 A1 Sep. 25, 2014

Related U.S. Application Data

(63) Continuation of application No. 12/693,818, filed on Jan. 26, 2010, now Pat. No. 8,759,131, which is a continuation of application No. 11/687,204, filed on Mar. 16, 2007, now Pat. No. 7,850,501, which is a continuation of application No. 10/967,281, filed on Oct. 19, 2004, now Pat. No. 7,205,716.

(30) Foreign Application Priority Data

Oct. 20, 2003 (JP) ................................ 2003-359778

(51) Int. Cl.
*H01L 27/32* (2006.01)
*H01L 51/56* (2006.01)
(Continued)

(52) U.S. Cl.
CPC ........... *H01L 27/3244* (2013.01); *H01L 27/322* (2013.01); *H01L 27/3276* (2013.01);
(Continued)

(58) Field of Classification Search
CPC ...................... H01L 51/5237; H01L 21/02126; H01L 51/0084; H01L 51/0004; H01L 21/02208; H01L 21/67109; H01L 27/15; H01L 33/44; H01L 51/525

USPC ............. 438/34, 790, 773, 763, 699, 787, 11, 438/47, 592; 313/504, 506; 257/421, 632, 257/72, E21.241, E21.277, E31.062, 257/E31.119; 345/76
See application file for complete search history.

(56) References Cited

U.S. PATENT DOCUMENTS 4,379,616 A   4/1983   Fleming, Jr. et al.
4,700,215 A   10/1987  McPherson
(Continued)

FOREIGN PATENT DOCUMENTS

CN   001420568 A   5/2003
EP   1128436 A     8/2001
(Continued)

OTHER PUBLICATIONS

Tang.C et al., "Electroluminescence of Doped Organic Thin Films", J. Appl. Phys. (Journal of Applied Physics), May 1, 1989, vol. 65, No. 9, pp. 3610-3616.
(Continued)

*Primary Examiner* — Ken Parker
*Assistant Examiner* — Bo Fan
(74) *Attorney, Agent, or Firm* — Fish & Richardson P.C.

(57) ABSTRACT

Techniques are provided for manufacturing a light-emitting device having high internal quantum efficiency, consuming less power, having high luminance, and having high reliability. The techniques include forming a conductive light-transmitting oxide layer comprising a conductive light-transmitting oxide material and silicon oxide, forming a barrier layer in which density of the silicon oxide is higher than that in the conductive light-transmitting oxide layer over the conductive light-transmitting oxide layer, forming an anode having the conductive light-transmitting oxide layer and the barrier layer, heating the anode under a vacuum atmosphere, forming an electroluminescent layer over the heated anode, and forming a cathode over the electroluminescent layer. According to the techniques, the barrier layer is formed between the electroluminescent layer and the conductive light-transmitting oxide layer.

20 Claims, 14 Drawing Sheets

(51) Int. Cl.
*H01L 51/50* (2006.01)
*H01L 51/52* (2006.01)

(52) U.S. Cl.
CPC ......... H01L51/5048 (2013.01); H01L 51/5088
(2013.01); *H01L 51/5092* (2013.01); *H01L*
*51/52* (2013.01); *H01L 51/5206* (2013.01);
*H01L 51/5237* (2013.01); H01L 51/56
(2013.01)

(56) References Cited

U.S. PATENT DOCUMENTS

| | | | |
|---|---|---|---|
| 5,294,810 A | 3/1994 | Egusa et al. | |
| 5,463,225 A * | 10/1995 | Kwasnick et al. | 250/370.11 |
| 5,640,067 A | 6/1997 | Yamauchi et al. | |
| 5,652,067 A | 7/1997 | Ito et al. | |
| 5,744,824 A | 4/1998 | Kousai et al. | |
| 6,111,274 A | 8/2000 | Arai | |
| 6,222,314 B1 | 4/2001 | Arai et al. | |
| 6,399,222 B2 | 6/2002 | Arai et al. | |
| 6,416,888 B1 | 7/2002 | Kawamura et al. | |
| 6,448,580 B1 | 9/2002 | Arai et al. | |
| 6,492,778 B1 | 12/2002 | Segawa | |
| 6,515,310 B2 | 2/2003 | Yamazaki et al. | |
| 6,541,918 B1 | 4/2003 | Yudasaka | |
| 6,614,174 B1 | 9/2003 | Urabe et al. | |
| 6,680,577 B1 | 1/2004 | Inukai et al. | |
| 6,734,671 B2 | 5/2004 | Murata et al. | |
| 6,833,560 B2 | 12/2004 | Konuma et al. | |
| 6,836,070 B2 | 12/2004 | Chung et al. | |
| 6,852,997 B2 | 2/2005 | Yamazaki et al. | |
| 6,897,607 B2 | 5/2005 | Sugimoto et al. | |
| 6,909,409 B2 | 6/2005 | Tanada | |
| 6,911,163 B2 | 6/2005 | Abe | |
| 7,015,640 B2 | 3/2006 | Schaepkens et al. | |
| 7,057,208 B2 | 6/2006 | Akimoto et al. | |
| 7,125,503 B2 | 10/2006 | Abe | |
| 7,132,693 B2 | 11/2006 | Konuma et al. | |
| 7,183,580 B2 | 2/2007 | Hayashi et al. | |
| 7,291,967 B2 | 11/2007 | Sakata et al. | |
| 7,294,517 B2 | 11/2007 | Takayama et al. | |
| 7,466,294 B2 | 12/2008 | Yamazaki et al. | |
| 7,492,090 B2 | 2/2009 | Yamazaki et al. | |
| 8,012,529 B2 | 9/2011 | Sakata et al. | |
| 2001/0019133 A1 * | 9/2001 | Konuma et al. | 257/79 |
| 2002/0038889 A1 | 4/2002 | Yamazaki et al. | |
| 2002/0053871 A1 | 5/2002 | Seo | |
| 2002/0093285 A1 | 7/2002 | Sugimoto et al. | |
| 2002/0113241 A1 | 8/2002 | Kubota et al. | |
| 2002/0153831 A1 | 10/2002 | Sakakura et al. | |
| 2003/0017360 A1 | 1/2003 | Tai et al. | |
| 2003/0038594 A1 | 2/2003 | Seo et al. | |
| 2003/0117070 A1 | 6/2003 | Komatsu et al. | |
| 2003/0127651 A1 | 7/2003 | Murakami et al. | |
| 2003/0146439 A1 | 8/2003 | Yamazaki et al. | |
| 2003/0235935 A1 | 12/2003 | Yamazaki et al. | |
| 2004/0004434 A1 | 1/2004 | Nishi et al. | |
| 2004/0021415 A1 | 2/2004 | Vong et al. | |
| 2004/0027507 A1 | 2/2004 | Iwakabe et al. | |
| 2004/0029338 A1 | 2/2004 | Yamazaki et al. | |
| 2004/0048100 A1 | 3/2004 | Ebisawa et al. | |
| 2004/0066137 A1 | 4/2004 | Hayashi | |
| 2004/0135151 A1 * | 7/2004 | Okamoto et al. | 257/72 |
| 2004/0169624 A1 | 9/2004 | Yamazaki et al. | |
| 2005/0052127 A1 | 3/2005 | Sakata et al. | |
| 2005/0082966 A1 | 4/2005 | Yamazaki et al. | |
| 2005/0084994 A1 | 4/2005 | Yamazaki et al. | |
| 2005/0093432 A1 | 5/2005 | Yamazaki et al. | |
| 2005/0110020 A1 | 5/2005 | Hayashi et al. | |
| 2005/0156519 A1 | 7/2005 | Yoshizawa et al. | |
| 2005/0224766 A1 | 10/2005 | Abe | |
| 2005/0224803 A1 | 10/2005 | Yamazaki et al. | |
| 2005/0242714 A1 | 11/2005 | Chung et al. | |
| 2005/0269943 A1 | 12/2005 | Hack et al. | |
| 2006/0061268 A1 | 3/2006 | Nakanishi | |
| 2006/0065894 A1 | 3/2006 | Jung et al. | |
| 2007/0051959 A1 | 3/2007 | Konuma et al. | |
| 2007/0259466 A1 | 11/2007 | Sakata et al. | |
| 2009/0042326 A1 | 2/2009 | Yamazaki et al. | |
| 2012/0012887 A1 | 1/2012 | Yamazaki et al. | |
| 2012/0129287 A1 | 5/2012 | Yamazaki et al. | |

FOREIGN PATENT DOCUMENTS

| | | |
|---|---|---|
| EP | 1376713 A | 1/2004 |
| EP | 1492387 A | 12/2004 |
| JP | 08-006053 A | 1/1996 |
| JP | 2000-012234 A | 1/2000 |
| JP | 2000-268954 A | 9/2000 |
| JP | 2001-312223 A | 11/2001 |
| JP | 3257913 | 2/2002 |
| JP | 2002-175879 A | 6/2002 |
| JP | 2003-114626 A | 4/2003 |
| JP | 2003-297551 A | 10/2003 |
| JP | 2004-087451 A | 3/2004 |

OTHER PUBLICATIONS

Office Action (Application No. 200410098142.2) Dated Sep. 7, 2007.

Office Action (Application No. 2004-299587) Dated May 11, 2010.

* cited by examiner

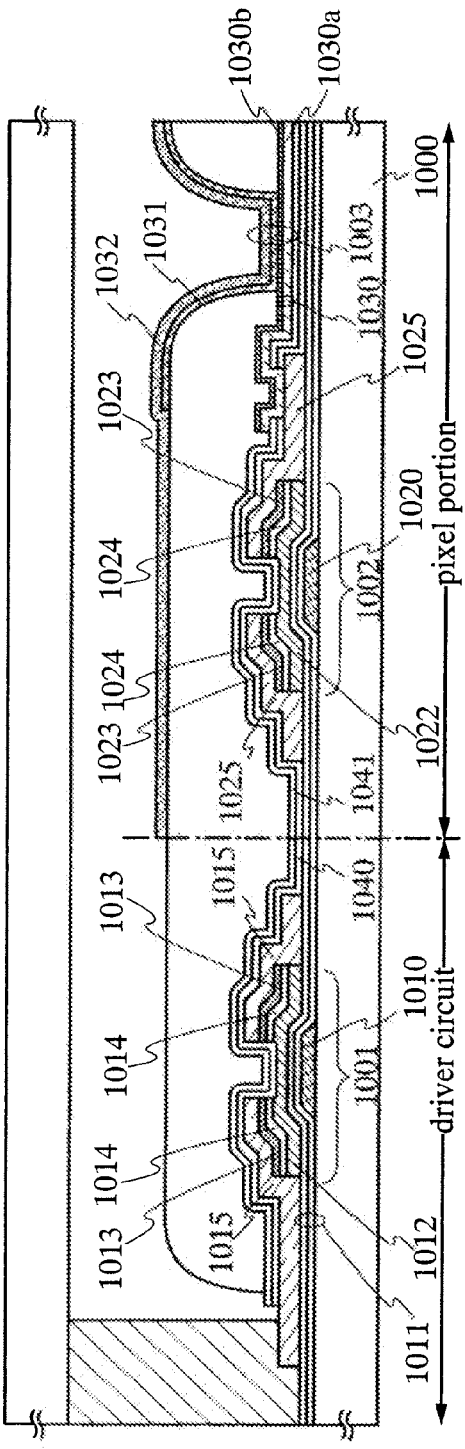
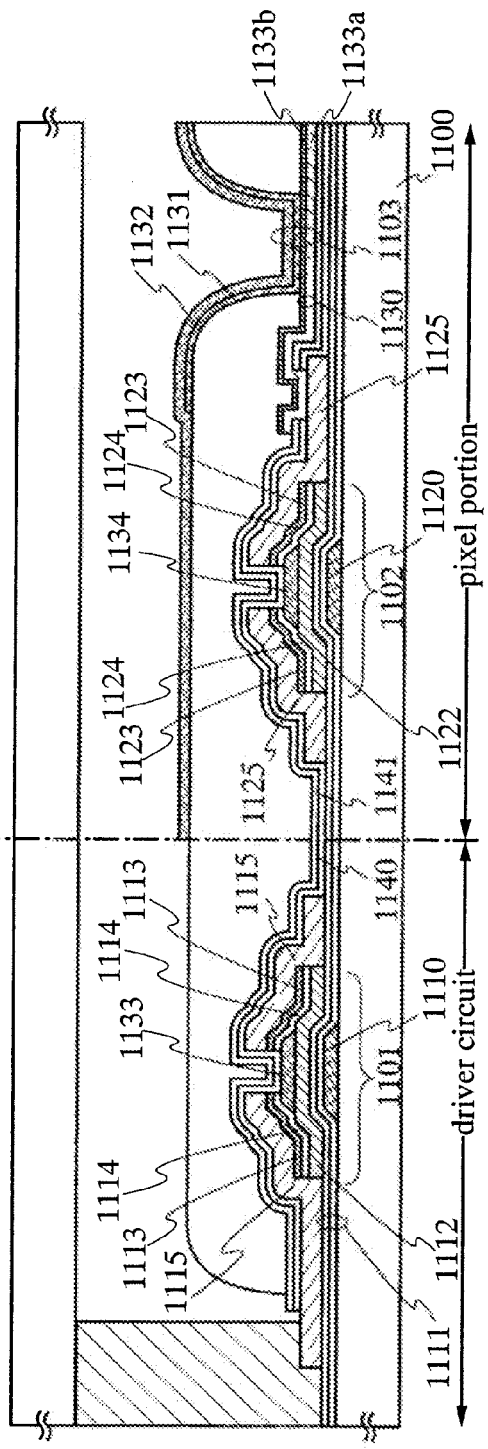

FIG. 14A  silicon nitride oxide
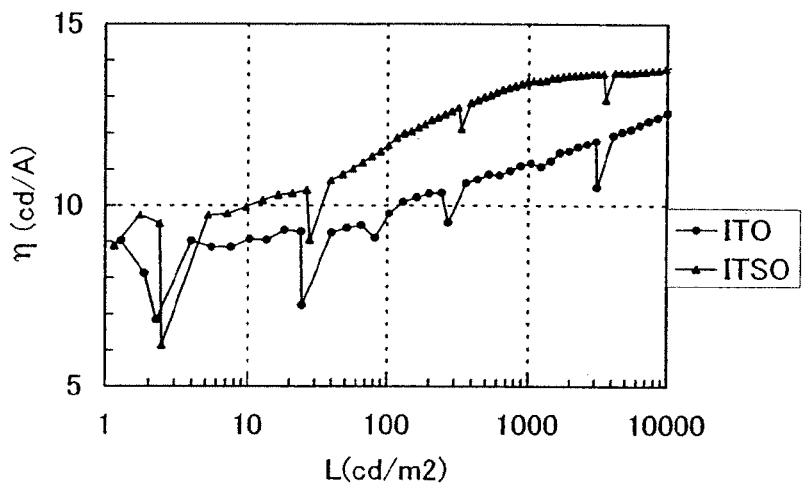
FIG. 14B  silicon nitride
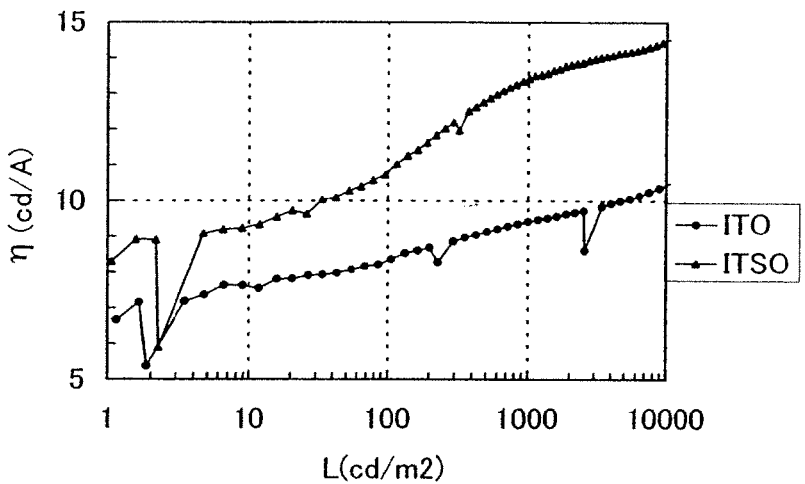
FIG. 14C  silicon oxide
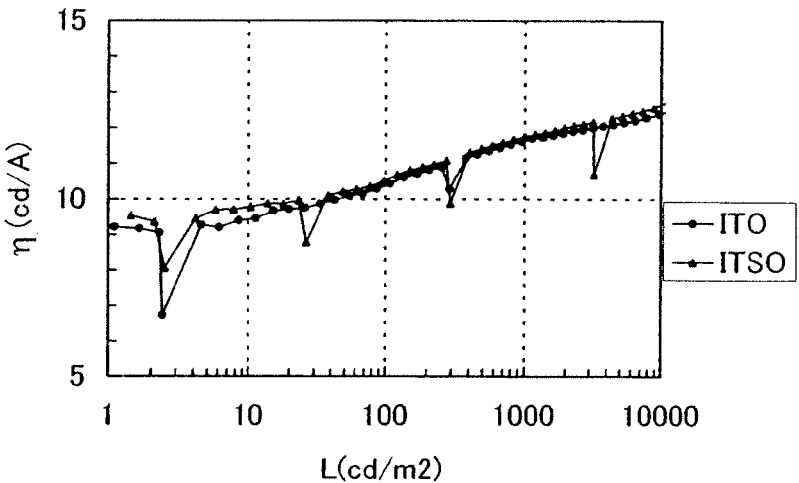

LIGHT-EMITTING DEVICE AND METHOD FOR MANUFACTURING LIGHT-EMITTING DEVICE

CROSS-REFERENCE TO RELATED APPLICATIONS

This application is a continuation of U.S. application Ser. No. 12/693,818, filed Jan. 26, 2010, now allowed, which is a continuation of U.S. application Ser. No. 11/687,204, filed Mar. 16, 2007, now U.S. Pat. No. 7,850,501, which is a continuation of U.S. application Ser. No. 10/967,281, filed Oct. 19, 2004, now U.S. Pat. No. 7,205,716, which claims the benefit of a foreign priority application filed in Japan as Serial No. 2003-359778 on Oct. 20, 2003, all of which are incorporated by reference.

FIELD OF THE INVENTION

The present invention relates to a light-emitting device and to a method for manufacturing the light-emitting device, in which each pixel comprises a light-emitting element.

RELATED ART

Since a light-emitting element emits light by itself, it is highly visible and does not require a backlight that is needed in a liquid crystal display device (LCD) and therefore the light-emitting element is best suited for a thin device. Moreover, the light-emitting element has a wider viewing angle than the LCD. For these reasons, attention has been paid to a light-emitting device using the light-emitting element as an alternative display device to a CRT and the LCD, and it has been tried to put the light-emitting device to practical use. An OLED (Organic Light Emitting Diode), which is one of the light-emitting elements, has an anode, a cathode, and a layer (hereinafter referred to as an electroluminescent layer) including an electroluminescent material where luminescence (electroluminescence) is obtained by applying an electric field. The OLED emits light by combining a hole injected from the anode and an electron injected from the cathode in the electroluminescent layer.

The work function of the material for forming the electrode is one indicator to determine the hole-injecting property and the electron-injecting property into the electroluminescent layer. It is desirable to use the material having low work function as an electrode (cathode) on the side where the electron is injected and to use the material having high work function as an electrode (anode) on the side where the hole is injected. Specifically, indium tin oxide (ITO) having a work function of approximately 5 eV is usually used as the anode.

Since the light-emitting device does not use the backlight, the power consumption of the light-emitting device more likely to depend on the performance of the light-emitting element of each pixel. That is to say, when the light-emitting element has higher external quantum efficiency (the number of photons extracted to the outside/the number of injected carriers), the less power consumption can be achieved. The external quantum efficiency can be raised by increasing the light extraction efficiency (the number of photons extracted to the outside/the number of emitted photons) or the internal quantum efficiency (the number of emitted photons/the number of injected carriers). The increase of the internal quantum efficiency means the decrease of the energy of the heat converted from the electricity given to the light-emitting element. Therefore, it is considered that the increase of the internal quantum efficiency not only reduces the power consumption but also suppresses the lowering of the reliability due to the heating.

As one factor to determine the internal quantum efficiency, an injection balance of the carrier (the proportion between the injected electron and the injected hole) is given. The injection balance depends on the work function of the electrode, the work function of a layer among the electroluminescent layer that contacts the electrode, and the mobility of the carrier in the electroluminescent layer. The internal quantum efficiency can be raised as the injection balance approaches 1.

However, it is not easy to find out the combination of the material of the electrode and the material of the electroluminescent material that can enhance the injection balance, and it is difficult to obtain sufficient luminance in spite of its high power consumption in the conventional light-emitting element. Moreover, the conventional light-emitting element has short half-life period of luminance and has a problem to be solved concerning the reliability. Although it is necessary that at least one electrode has light-transmitting property in order to extract the light from the light-emitting element, the material of the conductive light-transmitting film is limited and there are not many choices. Many conductive light-transmitting films are formed of ITO, and when ITO is used as the anode, it is necessary to optimize the material of the layer that has hole-transporting property and that contacts the anode. However, the development of the new material costs much and takes much time.

BRIEF SUMMARY OF THE INVENTION

The present invention is made in view of the above problems and it is an object of the present invention to provide a light-emitting device using a light-emitting element having the high internal quantum efficiency, consuming less power, having high luminance, and having high reliability. Moreover, it is an object of the present invention to provide a method for manufacturing such a light-emitting device.

The present inventors considered that the injection balance becomes poor because of the following reason. When a conductive layer including oxide and having light-transmitting property (hereinafter referred to as a conductive light-transmitting oxide layer: CTO) used as the anode contacts a layer having a hole-transporting property (a hole-injecting layer or a hole-transporting layer), the carrier moves so that Fermi potential corresponds. As a result, the energy band of the hole-injecting layer or the hole-transporting layer bends, and this bend prevents the hole-injecting property from improving and causes the injection balance to become poor.

FIG. 2 shows a band model in the condition where a conductive light-transmitting oxide layer contacts a hole-injecting layer (HIL). When the HIL does not contact the CTO, the Fermi potential is different in the HIL and the CTO, and the HIL has the flat energy band. However, when the HIL contacts the CTO, the energy band in the HIL bends in a direction where the barrier is formed against the electron so that the Fermi potential $E_F$ corresponds, and the hole comes to strong in the vicinity of the interface between the CTO and the HIL as shown in FIG. 2. For this reason, it is supposed that hole-injecting property and the hole mobility are suppressed, that the injection balance of the carrier is difficult to increase, and therefore that the increase of the internal quantum efficiency is interrupted.

Consequently, in the present invention, a highly insulative layer (hereinafter referred to as a barrier layer) having the thickness of such a degree that the tunneling current can flow is provided in a region of the anode that is closest to the hole-injecting layer or the hole-transporting layer. The barrier layer is formed of the material having higher resistance than the material of the layers in the anode except for the barrier layer and the material of the layers (the hole-injecting layer or the hole-transporting layer) that has the hole-transporting property and that contacts the barrier layer. With the above structure, the width of the energy band of the barrier layer can be made broader than those of the conductive light-transmitting oxide layer and the layer having the hole-transporting property. Specifically, in the present invention, the anode is formed of a conductive light-transmitting oxide material, and the barrier layer corresponding to a part of the anode is formed of the silicon oxide and the conductive light-transmitting oxide material or formed of a thin insulative or semi-insulative material including the silicon oxide.

FIGS. 1A and 1B show a band model in the condition where the barrier layer of the CTO contacts the HIL. The barrier layer includes the silicon oxide and is insulative or semi-insulative. The barrier layer is formed in the thickness of such a degree that the carrier can be tunneled, which is from 0.5 to 5 nm. By forming the barrier layer, the CTO and the HIL can be isolated physically. Thus, even when the Fermi potential $E_F$ corresponds in the CTO, the barrier layer, and the HIL as shown in FIG. 1A, the energy band of the CTO is flat. Therefore, since the hole-injecting property is improved and since the hole mobility is enhanced, the injection balance of the carrier can be enhanced. As a result, the internal quantum efficiency can be enhanced accordingly.

The energy band of the HIL is not always flat completely as shown in FIG. 1A, and it may bend in a direction where the energy is low as shown in FIG. 1B. However, unlike the bend of the energy band shown in FIG. 2, the bend of the energy band shown in FIG. 1B acts so as to interrupt the storage of the hole. As a result, since the hole-injecting property is improved and since the hole mobility is enhanced, the injection balance of the carrier is enhanced, and the internal quantum efficiency can be raised accordingly.

It is noted that the silicon oxide has the characteristic that it adsorbs the water molecule easily by chemical bonding. Therefore, it is considered that the CTO including the silicon oxide adsorbs the moisture on its surface more easily than the general CTO. FIGS. 3A and 3B show the quantity of gas exhausted from the substrate with respect to the temperature that is measured by a TDS (Thermal Desorption Spectroscopy) method. The substrate is in the condition where the anode is formed thereover but the layer having the hole-transporting property is not formed yet.

FIG. 3A shows the quantity of the exhausted gas with respect to the temperature when the silicon oxide and the ITO are used as the anode. FIG. 3B shows the quantity of the exhausted gas with respect to the temperature when the ITO is used as the anode. In both FIGS. 3A and 3B, after forming the anode, a heat treatment is performed for an hour at a temperature of 200° C. under the atmosphere. In the substrate used in FIG. 3A, the composition of the anode is O:Si:In:Sn=61:3:34:2.

In FIGS. 3A and 3B, the horizontal axes indicate the temperature of the heater used in the heat treatment. The actual temperature of the substrate is lower than the temperature of the heater and this tendency is more remarkable when the temperature of the heater is higher.

In both substrates used in FIGS. 3A and 3B, the peak showing the desorption of the water physically adsorbed is observed at a temperature of approximately 120° C. (the temperature of the substrate is also approximately 120° C.) as indicated by the horizontal axes of FIGS. 3A and 3B. However, unlike when only the ITO is used as the anode, when the silicon oxide and the ITO are used as the anode as shown in FIG. 3A, the peak showing the desorption of the water is observed again at the temperature ranging from approximately 350 to 370° C. (the temperature of substrate ranging from approximately 300 to 320° C.). It is considered that the peak observed at temperature ranging form 350 to 370° C. indicates the desorption of the moisture adsorbed on the silicon oxide by chemical bonding.

The above result of measurement by the TDS indicates that the barrier layer including the silicon oxide adsorbs the moisture on its surface more easily than the barrier layer including only the CTO. When the surface of the anode is contaminated by the moisture or the like, the work function lowers and therefore the hole-injecting property deteriorates. Therefore, the injection balance becomes poor, and the internal quantum efficiency lowers accordingly. Moreover, the moisture adsorbed on the surface of the anode may cause the deterioration of the electroluminescent layer.

Consequently, in the present invention, after forming the anode having the barrier layer and before forming the layer having the hole-transporting property, a heat treatment is performed under the atmosphere or a heat treatment (vacuum bake) is performed under the vacuum atmosphere to the anode in order to remove the moisture adsorbed on the surface of the barrier layer. With the above structure, it is possible to prevent the injection balance of the carrier from becoming poor and the reliability from lowering due to the moisture adsorbed on the barrier layer.

It is noted that the electroluminescent layer includes a plurality of layers in the present invention. These layers can be classified into a hole-injecting layer, a hole-transporting layer, a light-emitting layer, an electron-transporting layer, an electron-injecting layer, and the like in point of the carrier-transporting property. The hole-injecting layer and the hole-transporting layer are not always distinguished strictly and they are the same in point of that the hole-transporting property (the hole mobility) is important. In this specification, the layer contacting the anode is referred to as the hole-injecting layer and the layer contacting the hole-injecting layer is referred to as the hole-transporting layer for convenience. In the same way, the layer contacting the cathode is referred to as the electron-injecting layer and the layer contacting the electron-injecting layer is referred to as the electron-transporting layer. Sometimes the light-emitting layer also works as the electron-transporting layer and therefore it is also referred to as a light-emitting electron-transporting layer.

The electroluminescent layer may be formed of not only the organic material but also the material in which an organic material and an inorganic material are combined or the material in which a metal complex is added to the organic material when the same function is obtained.

The interface between the barrier layer and the conductive light-transmitting oxide layer is not always necessary to be clear. For example, the interface therebetween may change gradually so that the concentration of the oxide in the anode is higher toward the electroluminescent layer. Although the interface between the barrier layer and the conductive light-transmitting oxide layer is not clear in this case, the region closer to the electroluminescent layer still works as the barrier layer.

In the present invention described above, the conductive light-transmitting oxide layer can be formed of another conductive light-transmitting oxide material such as indium tin oxide (ITO), zinc oxide (ZnO), indium zinc oxide (IZO), or gallium-doped zinc oxide (GZO). It is preferable that the anode is formed by a sputtering method using a target including the conductive light-transmitting oxide material and the silicon oxide.

Advantageous Effect of the Invention

In the present invention, the hole-injecting property can be improved and the hole mobility can be enhanced by forming the barrier layer. As a result, the injection balance of the carrier can be enhanced and the internal quantum efficiency can be raised accordingly. Moreover, since the layer having the hole-transporting property is formed after removing the moisture adsorbed on the silicon oxide included in the barrier layer by the vacuum bake, it is possible to prevent the lowering of the hole-injecting property and to prevent the deterioration of the electroluminescent layer due to the moisture. Therefore, the present invention can provide a light-emitting element consuming less power, having high luminance, and having high reliability.

BRIEF DESCRIPTION OF THE DRAWINGS

FIGS. 7A and 7B are cross-sectional views of the light-emitting device manufactured by the present invention;

FIGS. 14A to 14C are graphs for showing the measured value of the current efficiency of the luminance.

DETAILED DESCRIPTION OF THE INVENTION

Figure 1A:
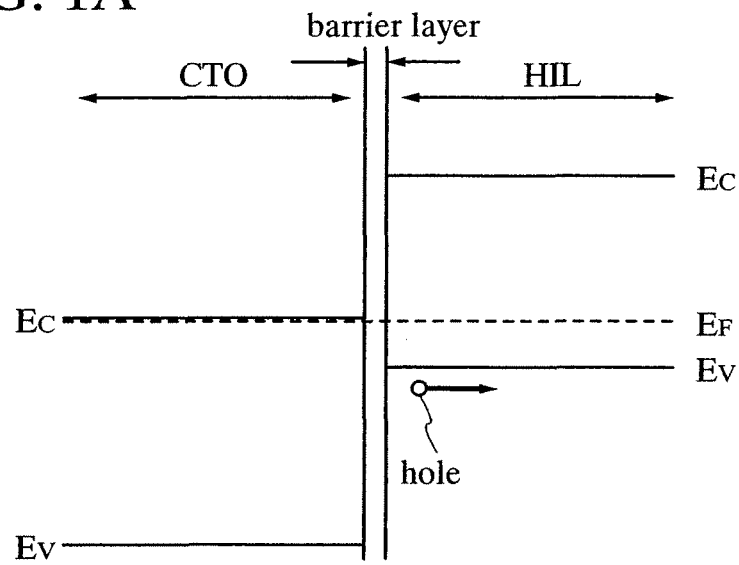
FIGS. 1A and 1B are drawings of a band model to explain the state in which an insulative or semi-insulative barrier film including silicon or silicon oxide is formed at the interface between the conductive light-transmitting oxide layer and the hole-injecting layer.
Figure 1B:
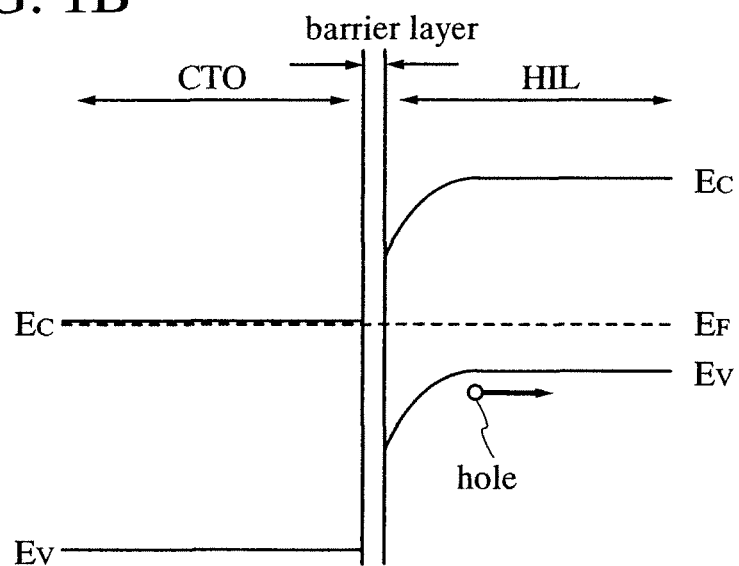
Figure 2:
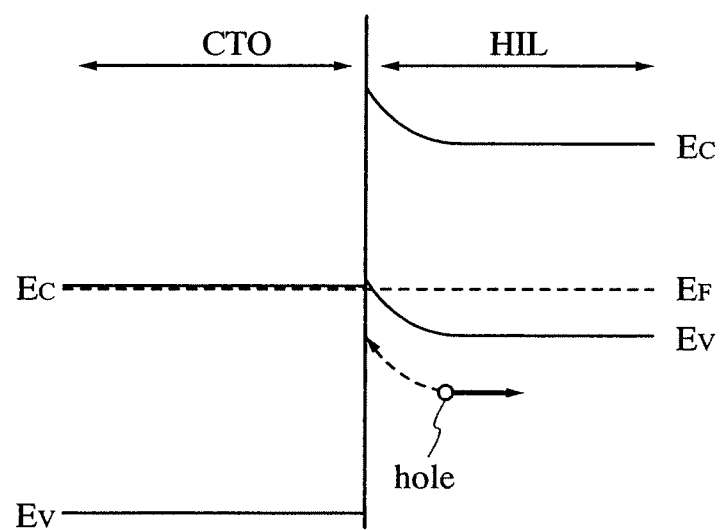
FIG. 2 is a drawing of a band model for showing the contact condition of the conventional conductive light-transmitting oxide layer and the hole-injecting layer.
Figure 3A:
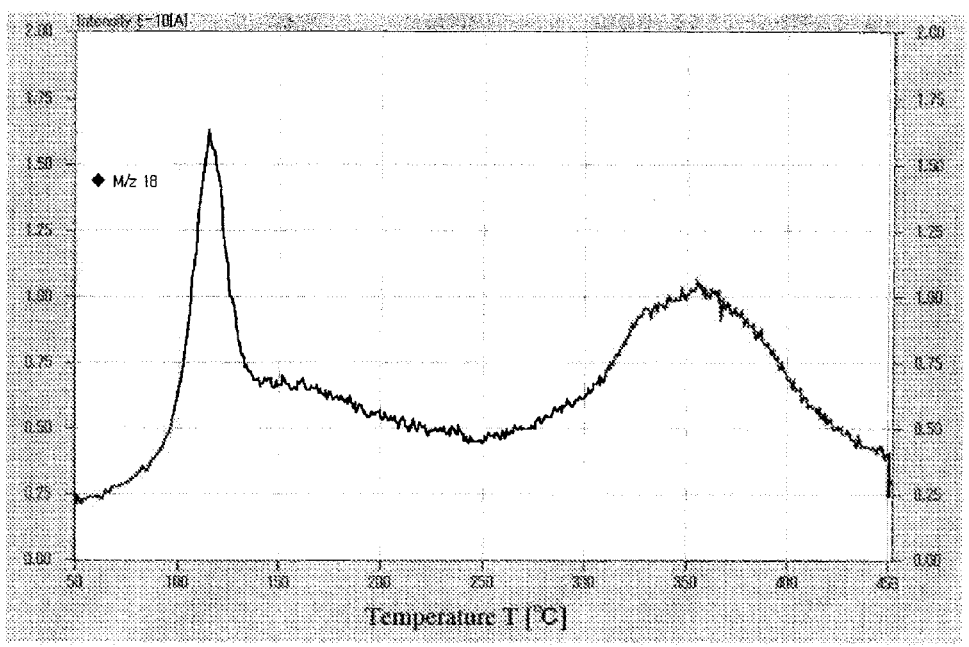
FIGS. 3A and 3B are graphs for showing the result of the measurement of TDS.
Figure 3B:
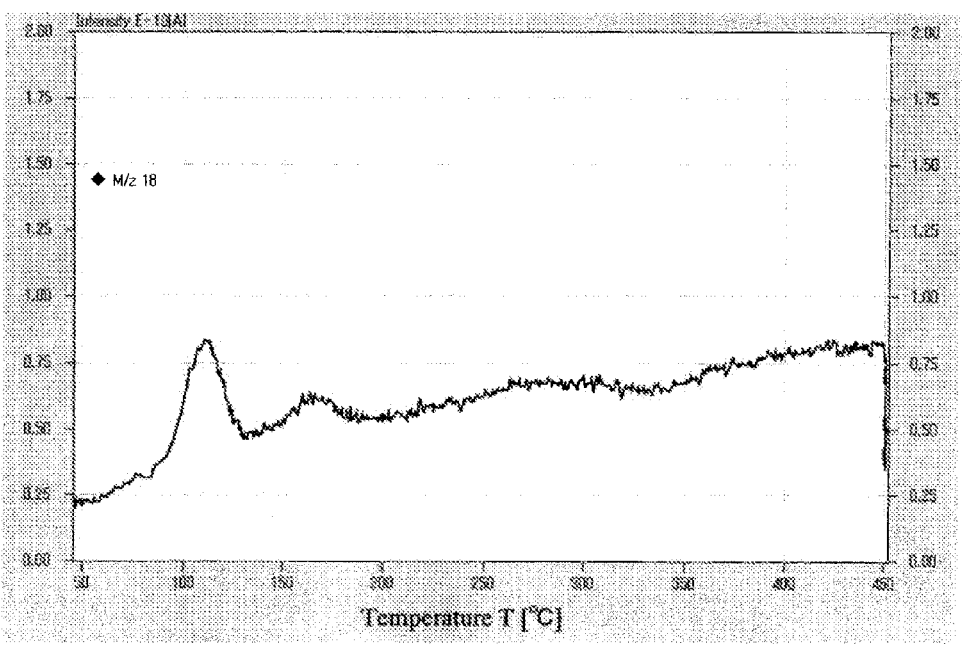

The embodiment mode of the present invention is hereinafter explained. The light-emitting element of the present invention has an electroluminescent layer provided between an anode formed of the conductive light-transmitting oxide material and of the silicon oxide and a cathode including alkali metal or alkali-earth metal. The electroluminescent layer is formed by laminating layers including the light-emitting organic compound. The layers including the organic compound can be classified into a hole-transporting layer, a light-emitting layer, and an electron-transporting layer according to its carrier-transporting property. Moreover, a hole-injecting layer may be provided between the anode and the hole-transporting layer, and an electron-injecting layer may be provided between the cathode and the electron-transporting layer. The distinction between the hole-injecting layer and the hole-transporting layer and between the electron-injecting layer and the electron-transporting layer is not strict and they are the same in point of that the hole-transporting property (the hole mobility) or the electron transporting property (the electron mobility) is important. In addition, a hole-blocking layer may be provided between the electron-transporting layer and the light-emitting layer. The light-emitting layer may emit the light of various colors by adding a guest material such as pigment or a metal complex to a host material. In other words, the light-emitting layer may be formed using a luminescence material or a phosphorescence material.

The anode is formed of the material in which the silicon oxide is added in the range of 1 to 10 atomic % to the conductive light-transmitting oxide material selected from the group consisting of indium tin oxide (ITO), zinc oxide (ZnO), indium zinc oxide (IZO), and gallium-doped zinc oxide (GZO). In a region of the anode that contacts the electroluminescent layer, a barrier layer that is insulative or semi-insulative and in which the density of the silicon is higher than another region in the anode is provided. The barrier layer has the thickness of such a degree that the carrier can move from the anode to the electroluminescent layer, which means the thickness of such a degree that the current flows by the tunneling current. The barrier layer separates physically the electroluminescent layer and the conductive light-transmitting oxide layer that is a part of the anode and that contacts the barrier layer, and this makes it possible for the carrier to move.

The anode including the conductive light-transmitting oxide material can be formed by the sputtering method using the target including the conductive light-transmitting oxide material and the silicon oxide. The content ratio of the silicon oxide to the conductive light-transmitting oxide material in the target may be in the range of 1 to 20 wt. %, preferably in the range of 2 to 10 wt. %. The content ratio of the silicon oxide may be determined in the above range appropriately because the anode has high resistance when the density of silicon oxide is increased in the above range. This provides the anode including the silicon oxide in the range of 1 to 10 atomic %, preferably in the range of 2 to 5 atomic %, and the conductive light-transmitting oxide material. When the same composition can be obtained, the anode may be formed by co-evaporation using the vacuum deposition method. The term co-evaporation refers to an evaporation method that evaporation source and heated simultaneously and different materials are mixed together at the deposition step.

The barrier layer can be formed in such a way that the conductive light-transmitting oxide material in the surface course of the anode including the silicon oxide and the conductive light-transmitting oxide material is removed so that the density of the silicon is higher than that of the conductive light-transmitting oxide material in the surface course of the anode. For example, the barrier layer can be formed by a method in which the surface is processed using a solution that can remove the conductive light-transmitting oxide material selectively; a plasma process using one or a plurality of gases selected from the group consisting of hydrogen, oxygen, and hydrofluoric acid; a plasma process using an inert gas such as nitrogen or argon; or the like.

In the case of changing the surface course of the anode into the barrier layer by removing the conductive light-transmitting oxide material from the surface course of the anode, it is preferable that the barrier layer is formed roughly at the submicron level to some extent because the barrier film is difficult to be formed when the conductive light-transmitting oxide layer is formed at high density. With the above structure, when the conductive light-transmitting oxide material is removed selectively, it is possible to increase the density of the added silicon efficiently in comparison with that of the conductive light-transmitting oxide material.

The barrier layer may be formed by increasing the density of the silicon in the region of the conductive light-transmitting oxide layer that is close to the surface intentionally when forming the conductive light-transmitting oxide layer. Specifically, a barrier layer may be formed in such a way that after forming the conductive light-transmitting oxide layer, the barrier layer in which the weight percentage of the silicon is higher may be formed newly on the conductive light-transmitting oxide layer formed previously by changing the composition of the target used in the sputtering so that the density of the silicon becomes higher.

In the present invention, before forming the electroluminescent layer, a heat treatment is performed to the anode under the atmosphere or the vacuum atmosphere (preferably at the pressure in the range of approximately $10^{-4}$ to $10^{-8}$ Pa) at temperature of the substrate ranging from 200 to 450° C., preferably from 250 to 300° C. Moreover, a washing process or a polishing process may be performed in order to clean and to enhance the flatness.

In the light-emitting element having the above structure, an original advantageous effect of the work function of the anode can be obtained because the anode and the hole-injecting layer or the hole-transporting layer do not contact each other. In other words, the hole injection efficiency to the hole-injecting layer can be raised and the injection balance can be enhanced. As a result, the internal quantum efficiency can be raised.

Figure 4A:
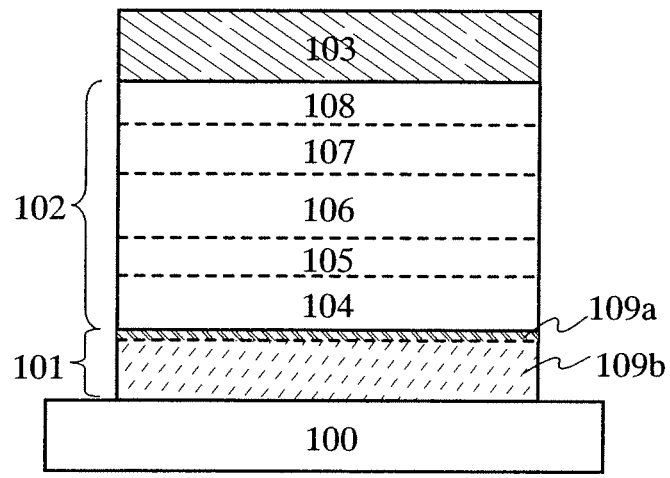
FIGS. 4A and 4B are drawings for showing a structure of the light-emitting element in the light-emitting device of the present invention.

FIG. 4A shows the structure of the light-emitting element obtained by the present invention. The light-emitting element shown in FIG. 4A has an anode 101 formed on a substrate 100, an electroluminescent layer 102 formed on the anode 101, and a cathode 103 formed on the electroluminescent layer 102.

The anode 101 has a barrier layer 109a and a conductive light-transmitting oxide layer 109b. The barrier layer 109a is between the conductive light-transmitting oxide film 109b and the electroluminescent layer 102.

The cathode 103 can be formed of metal, alloy, conductive compound, or the mixture of these each of which has low work function and is usually used as the cathode of the light-emitting element. Specifically, the cathode can be formed of alkali metal such as Li or Cs; alkali-earth metal such as Mg, Ca, or Sr; alloy including these such as Mg:Ag or Al:Li; or rare-earth metal such as Yb or Er. When the layer including the material having high electron-injecting property is formed so as to contact the cathode 103, the general conductive film using aluminum, conductive light-transmitting oxide material, or the like can be used as the cathode 103.

In FIG. 4A, the electroluminescent layer 102 has first to fifth layers 104 to 108.

Since the first layer 104 formed on the barrier layer 109a works as the hole-injecting layer, it is desirable that the first layer 104 is formed of the material having hole-transporting property, having comparatively low ionization potential, and having high hole-injecting property. The material is classified broadly into metal oxide, low-molecule organic compound, and high-molecule organic compound. As the metal oxide, for example, vanadium oxide, molybdenum oxide, ruthenium oxide, or aluminum oxide can be used. As the low-molecule organic compound, for example, starburst amine typified by m-MTDATA, metallo phthalocyanine typified by copper phthalocyanine (abbreviation Cu-Pc), phthalocyanine (abbreviation $H_2$-Pc), 2,3-dioxyethylenethiophene derivative can be used. Moreover, a film formed by co-evaporating the low-molecule organic compound and the above metal oxide may be used. As the high-molecule organic compound, for example, polymer molecule such as polyaniline (abbreviation PAni), polyvinylcarbazole (abbreviation PVK), or polythiophene derivative can be used. Polyethylenedioxythiophene (abbreviation PEDOT), which is one of the polythiophene derivatives, with polystyrenesulfonic acid (abbreviation PSS) doped may be used. Moreover, benzoxyazole derivative may be used in combination with one or a plurality of materials selected from the group consisting of TCQn, $FeCl_3$, $C_{60}$, and $F_4$TCNQ.

It is preferable that the second layer 105 formed on the first layer 104 is made of the known material having high hole-transporting property and having low crystallinity because the second layer 105 works as the hole-transporting layer. Specifically, the aromatic amine compound (which means the material having nitrogen-benzene ring bond) such as 4, 4-bis [N-(3-methylphenyl)-N-phenyl-amino]biphenyl (abbreviation TPD), its derivative 4,4'-bis [N-(1-naphtyle)-N-phenyl-amino]biphenyl (abbreviation α-NPD), and the like are given. Moreover, a starburst aromatic amine compound such as 4,4',4"-tris(N,N-diphenylamino)triphenylamine (abbreviation TDATA) or MTDATA can be used. Furthermore, 4,4', 4"-tris(N-carbazolyl)triphenylamine (abbreviation TCTA) can be used. As the high-molecule material, poly vinylcarbazole showing good hole-transporting property can be used.

It is preferable that the third layer 106 formed on the second layer 105 is formed of the material having high ionization potential and large band gap because the third layer 106 works as the light-emitting layer. Specifically, for example, metal complex such as tris(8-quinolinolato)aluminum (abbreviation $Alq_3$), tris(4-methyl-8-quinolinolato)aluminum (abbreviation $Almq_3$), bis(10-hydroxybenzo[η]-quinolinolato) beryllium (abbreviation $BeBq_2$), bis(2-methyl-8-quinolinolato)-(4-hydroxy-biphenylyl)-aluminum (abbreviation BAlq), bis[2-(2-hydroxyphenyl)-benzooxazolate]zinc (abbreviation $Zn(BOX)_2$), or bis[2-(2-hydroxyphenyl)-benzothiazolate]zinc (abbreviation $Zn(BTZ)_2$) can be used. Moreover, luminescent pigment (for example, coumarin derivative, quinacridone derivative, rubrene, 4,4-dicyanomethylene, 1-pyrone derivative, stilbene derivative, condensed aromatic compound, and the like) can be used. Furthermore, phosphorescent material such as platinum octaethylporphyrin complex, tris(phenylpyridine) iridium complex, or tris (benzylidyneacetonato) phenanthreneeuropium complex can be used.

As the host material of the third layer 106, the hole-transporting material or the electron-transporting material typified by the above example can be used. Moreover, a bipolar material such as 4,4'-N,N'-dicarbazolylbiphenyl (abbreviation CBP) can be used.

It is desirable that the fourth layer 107 formed on the third layer 106 is formed of the material having high electron-transporting property because the fourth layer 107 works as the electron-transporting layer. Specifically the metal complex having quinoline skeleton or benzoquinoline skeleton typified by $Alq_3$ or its mixed ligand complex can be used. Specifically, the metal complex such as $Alq_3$, $Almq_3$, $BeBq_2$, $BAlq$, $Zn(BOX)_2$, or $Zn(BTZ)_2$ can be given. Moreover, not only the metal complex but also oxadiazole derivative such as 2-(4-biphenylyl)-5-(4-tert-buthylphenyl)-1,3,4-oxadiazole (abbreviation PBD) and 1,3-bis[5-(p-tert-buthylphenyl)-1,3, 4-oxadiazole-2-yl]benzene (abbreviation OXD-7); triazole derivative such as 3-(4-tert-buthylphenyl)-4-phenyl-5-(4-biphenylyl)-1,2,4-triazole (abbreviation TAZ) and 3-(4-tert-buthylphenyl)-4-(4-ethylphenyl)-5-(4-biphenylyl)-1,2,4-triazole (abbreviation p-EtTAZ); an imidazole derivative such as TPBI; and phenanthroline derivative such as bathophenanthroline (BPhen) and bathocuproine (BCP) can be used.

It is desirable that the fifth layer 108 formed on the fourth layer 107 is formed of the material having high electron-injecting property because the fifth layer 108 works as the electron-injecting layer. Specifically, the fifth layer 108 is often formed of a very thin film made of the insulator such as alkali metal halide such as LiF or CsF; alkali-earth metal halide such as $CaF_2$; or alkali metal oxide such as $Li_2O$ is often used. Moreover, alkali metal complex such as lithium acetylacetonate (abbreviation Li (acac)) or 8-quinolilato-lithium (abbreviation Liq) is also effective. In addition, the fifth layer 108 may include benzoxazole derivative or the metal oxide such as molybdenum oxide (MoOx), vanadium oxide (VOx), ruthenium oxide (RuOx), or tungsten oxide (WOx) with one or a plurality of materials selected from the group consisting of alkali metal; alkali-earth metal; and transition metal.

In the light-emitting element having the above structure, the light is generated from the third layer 106 by applying the voltage between the anode 101 and the cathode 103 and by supplying the current of forward bias in the electroluminescent layer 102. Thus, the light can be extracted from the side of the anode 101. It is noted that the electroluminescent layer 102 does not always have to include all these first to fifth layers. In the present invention, the electroluminescent layer may include at least the light-emitting layer and one of the electron-transporting layer and the electron-injecting layer. In addition, the light may be obtained not only from the third layer 106 but also from another layer.

Depending on the color of the light, the phosphorescent material may be able to make the driving voltage lower and to provide higher reliability than the fluorescent material. Consequently, when full-color display is performed using the light-emitting element corresponding to each of the three primary colors, the light-emitting element using the fluorescent material and the light-emitting element using the phosphorescent material may be combined so that the degree of deterioration is made the same in the light-emitting elements of three primary colors.

Figure 4B:
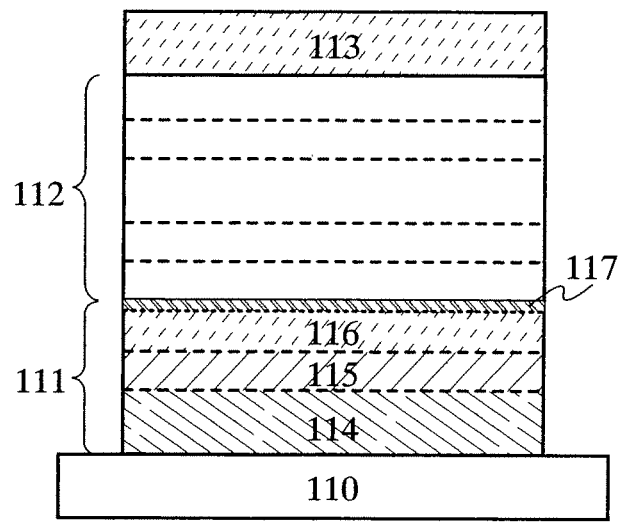

Next, the structure of the light-emitting element in which the light can be extracted from the cathode side is explained. FIG. 4B shows the light-emitting element obtained by the present invention, which has an anode 111 formed over a substrate 110, an electroluminescent layer 112 formed on the anode 111, and a cathode 113 formed on the electroluminescent layer 112.

The anode 111 may be formed of a single layer including one or a plurality of elements selected from the group consisting of TiN, ZrN, Ti, W, Ni, Pt, Cr, Ag, and the like; two layers formed by laminating a titanium nitride film and a film mainly including aluminum; three layers formed by laminating a titanium nitride film, a film mainly including aluminum, and a titanium nitride film; or the like. Moreover, the anode 111 may be formed by laminating the conductive light-transmitting oxide layer using ITO, indium tin oxide including silicon oxide (hereinafter referred to as ITSO), IZO, or the like and the barrier layer on any one of the above single layer, two layers, and three layers that can reflect the light. In FIG. 4B, the anode 111 is formed by laminating an Al—Si layer 114, a Ti layer 115, a conductive light-transmitting oxide layer 116, and a barrier layer 117 in order from the side of the substrate 110.

The conductive light-transmitting oxide layer 116 is formed of the conductive light-transmitting oxide material and the silicon oxide. The barrier layer 117 is formed of the silicon oxide or formed of the conductive light-transmitting oxide material and the silicon oxide. The density of the silicon is higher in the barrier layer 117 than in the conductive light-transmitting oxide layer 116.

The cathode 103 has light-transmitting property. Specifically, the cathode 103 may be formed of the conductive light-transmitting oxide material selected from the group consisting of the indium tin oxide (ITO), zinc oxide (ZnO), indium zinc oxide (IZO), gallium-doped zinc oxide (GZO), and the like or may be formed of the silicon oxide and the conductive light-transmitting oxide material. In this case, it is desirable that the electron-injecting layer is provided in the electroluminescent layer so as to contact the cathode 103.

The cathode 103 may be formed of metal, alloy, conductive chemical compound, or mixture of these each of which has low work function and has the thickness of such a degree that the light can transmit. Specifically, the cathode 103 can be formed of the alkali metal such as Li or Cs; alkali-earth metal such as Mg, Ca, or Sr; the alloy including these such as Mg:Ag or Al:Li; rare-earth metal such as Yb or Er in a thickness from approximately 5 to 30 nm. In the case of providing the electron-injecting layer, the cathode 103 can be formed of another conductive layer such as an Al film in the thickness of such a degree that the light can transmit. In the case of forming the cathode 103 in the thickness of such a degree that the light can transmit, the conductive light-transmitting oxide layer may be formed of the conductive light-transmitting oxide material on the cathode in order to suppress the sheet resistance of the cathode.

The electroluminescent layer 112 may have the same structure as the electroluminescent layer 102 shown in FIG. 4A. However, when the work function of the material used as the cathode is not low sufficiently, it is desirable to provide the electron-injecting layer.

Next, a method for manufacturing the light-emitting device of the present invention is explained in detail. The present embodiment mode explains the example in which an n-channel TFT and a p-channel TFT are manufactured over the same substrate.

Figure 5A:
FIGS. 5A to 5C are drawings for showing the manufacturing method of the light-emitting device of the present invention.

As FIG. 5A indicates, a base film 202 is formed on a substrate 201. As the substrate 201, a glass substrate such as a bariumborosilicate glass or an aluminoborosilicate glass, a quartz substrate, a ceramic substrate, or the like can be used. In addition, a silicon substrate or a metal substrate including a stainless substrate with an insulating film formed over the surface may be used. Although a substrate made of flexible synthetic resin such as plastic tends to be inferior to the above substrates in point of the resistance against the heat, the substrate made of flexible synthetic resin can be used when it can resist the heat generated in the manufacturing process.

The base film 202 is provided in order to prevent alkaline-earth metal or alkali metal such as Na included in the substrate 201 from diffusing into the semiconductor film and from causing an adverse effect on the characteristic of the semiconductor element such as a TFT. Therefore, the base film is formed of an insulating film such as silicon oxide, silicon nitride, or silicon nitride oxide, which can suppress the diffusion of the alkaline-earth metal and alkali metal into the semiconductor film. In the present embodiment mode, a silicon nitride oxide film is formed in a thickness from 10 to 400 nm (preferably from 50 to 300 nm) by a plasma CVD method.

The base film 202 may be a single layer or a multilayer formed by laminating a plurality of insulating films. In the case of using the substrate including the alkali metal or the alkaline-earth metal in any way such as the glass substrate, the stainless substrate, or the plastic substrate, it is effective to provide the base film in terms of preventing the diffusion of the impurity. When the diffusion of the impurity does not lead to any significant problems, for example when the quartz substrate is used, the base film does not always have to be provided.

Next, island-shaped semiconductor films 203 and 204 used as an active layer are formed on the base film 202 in a thickness from 25 to 100 nm (preferably from 30 to 60 nm). The island-shaped semiconductor films 203 and 204 may be an amorphous semiconductor, a semi-amorphous semiconductor (micro-crystal semiconductor), or a poly-crystalline semiconductor. In addition, not only silicon but also silicon germanium can be used as the semiconductor. When the silicon germanium is used, it is preferable that the density of germanium is in the range of 0.01 to 4.5 atomic %.

In the case of using the poly-crystalline semiconductor, an amorphous semiconductor may be formed and then the amorphous semiconductor may be crystallized by a known crystallizing method. As the known crystallizing method, a crystallizing method by heating with the use of a heater, a crystallizing method by laser light irradiation, a crystallizing method using catalyst metal, or a crystallizing method using infrared light, or the like is given.

When the crystallizing method by the laser light irradiation is employed, a pulsed or continuous wave excimer laser, a YAG laser, a $YVO_4$ laser, or the like may be used. For example, when the YAG laser is used, it is preferable to use a second harmonic, which is easily absorbed in the semiconductor film. The pulsed repetition rate is set in the range of 30 to 300 kHz, the energy density is set in the range of 300 to 600 $mJ/cm^2$ (typically in the range of 350 to 500 $mJ/cm^2$), and the scanning speed may be determined so that several shots can be irradiated to any point.

Figure 5B:
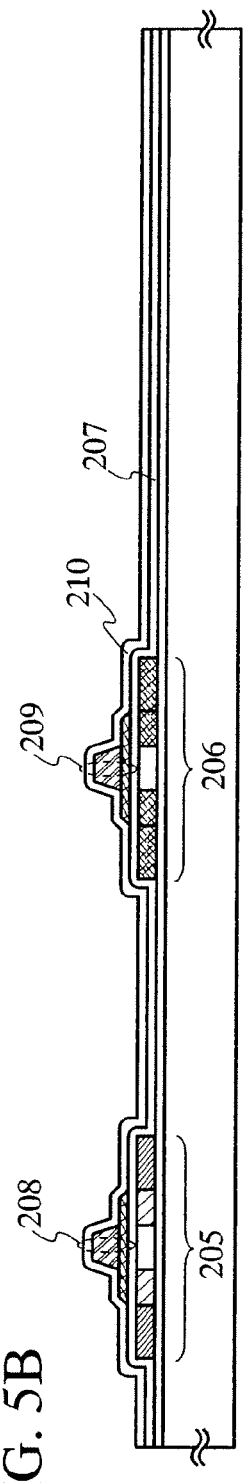

Next, a TFT is formed by using the island-shaped semiconductor films 203 and 204. Although top-gate type TFTs 205 and 206 are formed using the island-shaped semiconductor films 203 and 204 as shown in FIG. 5B in this embodiment mode, the structure of the TFT is not limited to this, and the TFT may be a bottom-gate type.

Specifically, a gate insulating film 207 is formed so as to cover the island-shaped semiconductor films 203 and 204. Then, a conductive film is formed on the gate insulating film 207 and patterned, thereby forming gate electrodes 208 and 209. Subsequently, a source region, a drain region, an LDD region, and the like are formed in such a way that an impurity imparting n-type or p-type is added to the island-shaped semiconductor films 203 and 204 using the gate electrodes 208 and 209 as a mask or using the resist that is formed and patterned as a mask. It is noted that the TFT 205 is n-type, and the TFT 206 is a p-type in this embodiment mode.

It is noted that the gate insulating film 207 can be formed of silicon oxide, silicon nitride, silicon nitride oxide, or the like by a plasma CVD method, a sputtering method, or the like. In the case of forming the gate insulating film using the silicon oxide by the plasma CVD method, the gate insulating film can be formed under the condition where the mixed gas of TEOS (Tetraethyl Orthosilicate) and $O_2$ is used, the reaction pressure is 40 Pa, the substrate temperature ranges from 300 to 400° C., and the electric density ranges from 0.5 to 0.8 $W/cm^2$ at high frequency (13.56 MHz).

The gate insulating film 207 can be formed of aluminum nitride. The heat conductivity of the aluminum nitride is comparatively high and therefore the heat generated in the TFT can be diffused efficiently. The gate insulating film may be formed in such a way that after forming the silicon oxide, silicon oxynitride, or the like not including aluminum, the aluminum nitride is formed thereon.

The above processes can form the n-channel TFT 205 and the p-channel TFT 206 for controlling the current supplied to the light-emitting element. The manufacturing method of the TFT is not limited to the above. The gate electrode and the wiring may be formed by a droplet discharging method.

Next, a passivation film 210 is formed so as to cover the TFTs 205 and 206. The passivation film 210 can be formed of the insulating film including silicon such as silicon oxide, silicon nitride, or silicon oxynitride in a thickness from approximately 100 to 200 nm.

Next, a heat treatment is performed to activate the impurity element added in the island-shaped semiconductor films 203 and 204. This treatment can be performed by a thermal anneal method using an annealing furnace, a laser anneal method, or a rapid thermal anneal (RTA) method. For example, when the thermal anneal method is used to activate the impurity element, the heat treatment is performed under the atmosphere of nitrogen in which the density of oxygen is 1 ppm or less, preferably 0.1 ppm or less, at temperatures ranging from 400 to 700° C. (preferably from 500 to 600° C.). Moreover, another heat treatment is performed under the atmosphere including hydrogen in the range of 3 to 100% at temperatures ranging from 300 to 450° C. for 1 to 12 hours to hydrogenate the island-shaped semiconductor film. This process is to terminate the dangling bond by the hydrogen excited thermally. Plasma hydrogenation (using hydrogen excited to be the plasma) may be performed as another means for hydrogenation. The activation process may be performed before forming the passivation film 210.

Figure 5C:
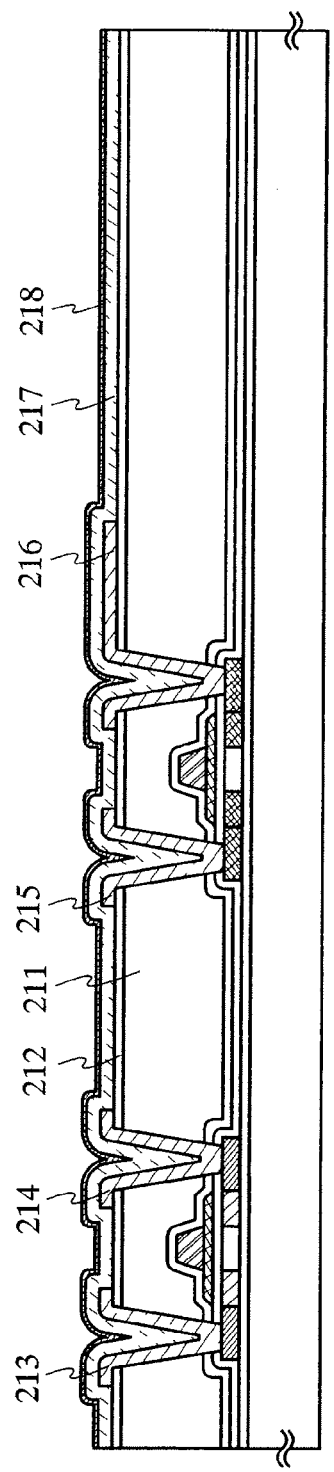

Next, a first interlayer insulating film 211 and a second interlayer insulating film 212 are formed to cover a passivation film 210 as shown in FIG. 5C. The first interlayer insulating film 211 can be formed of an organic resin film, an inorganic insulating film, an insulating film including Si—O bond and Si—$CH_x$ bond made from the material selected from the siloxane group, or the like. The insulating film formed using the material selected from the siloxane group is used in this embodiment mode. As the second interlayer insulating film 212, a film that is hard to transmit the material for promoting the deterioration of the light-emitting element such as moisture or oxygen compared to another insulating film is used. A silicon nitride film formed by an RF sputtering method is typically used. Moreover, a diamond-like-carbon (DLC) film, the aluminum nitride film, or the like can be also used.

Subsequently, the passivation film 210, the first interlayer insulating film 211, and the second interlayer insulating film 212 are etched to form a contact hole. Then, wirings 213 to 216 to connect with the island-shaped semiconductor films 203 and 204 are formed.

Next, a conductive light-transmitting oxide layer 217 is formed to cover the second interlayer insulating film 212 and the wirings 213 to 216. In this embodiment mode, the conductive light-transmitting oxide layer 217 is formed of the ITSO by the sputtering method. Not only the ITSO but also indium oxide including silicon oxide with zinc oxide (ZnO)

mixed in the range of 2 to 20% may be used as the conductive light-transmitting oxide layer 217.

In the case of using the ITSO, the ITO including the silicon oxide in the range of 2 to 10 wt. % can be used as the target. Specifically, the conductive light-transmitting oxide layer 217 is formed in 105 nm thick under the condition where the target including $In_2O_3$ for 85 wt. %, $SnO_2$ for 10 wt. %, and $SiO_2$ for 5 wt. % is used, the flow rate of Ar is 50 sccm, the flow rate of $O_2$ is 3 sccm, the sputtering pressure is 0.4 Pa, the sputtering electric power is 1 kW, and the film-forming speed is 30 nm/min.

In this embodiment mode, a barrier layer 218 having higher density of Si than the conductive light-transmitting oxide layer 217 is formed on the conductive light-transmitting oxide layer 217. Specifically, the barrier layer 218 is formed in 5 nm thick by the sputtering method using the target including $In_2O_3$ for 83 wt. %, $SnO_2$ for 7 wt. %, and $SiO_2$ for 10 wt. %.

It is noted that the surface of the conductive light-transmitting oxide layer 217 may be polished by a CMP method or by washing it using porous body belonging to polyvinyl alcohol group before forming the barrier layer 218 so that the surface of conductive light-transmitting oxide layer 217 is flattened.

The barrier layer may be formed by removing the conductive light-transmitting oxide material selectively from the surface of conductive light-transmitting oxide layer and by increasing the density of the added silicon. In this case, the barrier layer may be formed after patterning the conductive light-transmitting oxide layer or after forming a partition wall.

Figure 6A:
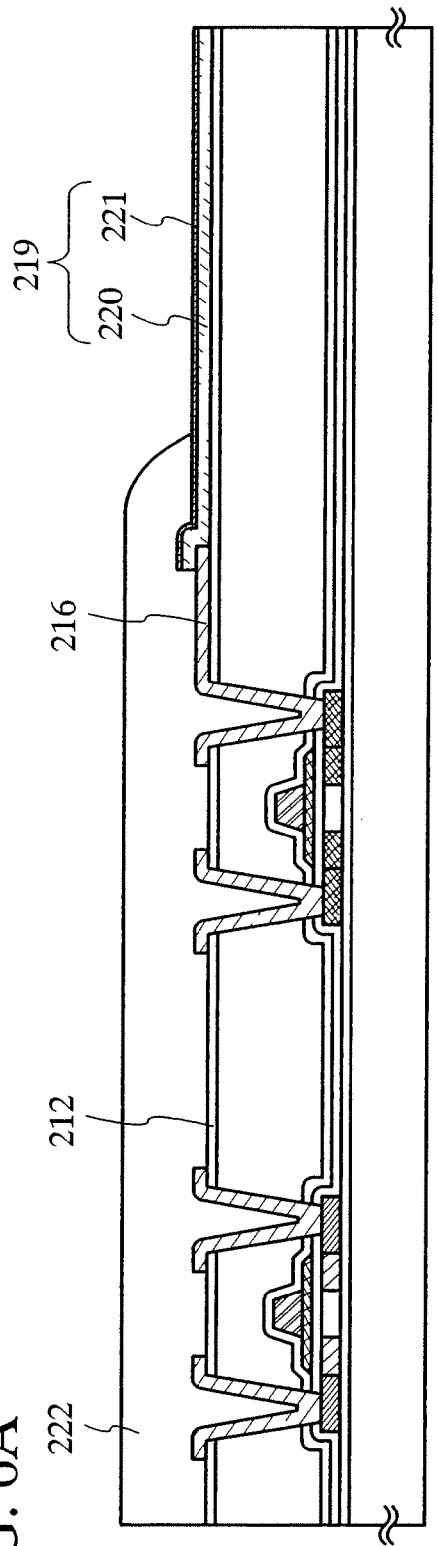
FIGS. 6A and 6B are drawings for showing the manufacturing method of the light-emitting device of the present invention.

Next, as shown in FIG. 6A, an anode 219 connected to the wiring 216 is formed by patterning the conductive light-transmitting oxide layer 217 and the barrier layer 218. A reference numeral 220 denotes the patterned conductive light-transmitting oxide layer and a reference numeral 221 denotes the patterned barrier layer.

A partition wall 222 is formed on the second interlayer insulating film 212. An organic resin film, an inorganic insulating film, an insulating film including Si—O bond and Si—$CH_x$ bond made from the material selected from the siloxane group, or the like can be used as the partition wall 222. The partition wall 222 is formed so as to cover the edge portion of the anode 219 and to have an opening in the region overlapping the anode 219. It is preferable to make the edge portion of the opening of the barrier 222 round so as to prevent the electroluminescent layer to be formed afterward from boring. More specifically, it is desirable that the sectional surface of the barrier 222 at the edge of the opening has a radius of curvature ranging from approximately 0.2 to 2 μm.

FIG. 6A shows an example using positive photosensitive acrylic resin as the barrier 222. In the photosensitive organic resin, there are the positive type in which the region where the energy such as light, electron, ion, or the like is exposed is removed and the negative type in which the region that is exposed is not removed. The present invention may use the negative organic resin. Moreover, a photosensitive polyimide may be used to form the barrier 222. In the case of forming the barrier 222 using the negative acrylic, the edge portion of the opening shapes like a letter of S. On this occasion, it is desirable that the radius of curvature in the upper portion and the lower portion of the opening is in the range of 0.2 to 2 μm.

With the above structure, the coverage of the electroluminescent layer and the cathode to be formed afterward can be improved and it is possible to prevent the electroluminescent layer from boring. As a result, the anode 219 and the cathode are prevented from shorting. Moreover, when the stress of the electroluminescent layer is relaxed, it is possible to decrease the defect called shrink in which the light-emitting region decreases and to enhance the reliability.

Next, a heat treatment is performed under the atmosphere or a heat treatment (vacuum bake) is performed under the vacuum atmosphere before forming the electroluminescent layer in order to remove the moisture, oxygen, and the like adsorbed on the barrier 222 and the anode 219. Specifically, the heat treatment is performed under the vacuum atmosphere at the temperature of the substrate ranging from 200 to 450° C., preferably from 250 to 300° C., for approximately 0.5 to 20 hours. It is desirable that the pressure is set to $3 \times 10^{-7}$ Torr or less, and it is the most desirable that the pressure is set to $3 \times 10^{-8}$ Torr or less if possible. When the electroluminescent layer is formed after the heat treatment under the vacuum atmosphere, the reliability can be further enhanced by keeping the substrate under the vacuum atmosphere until just before forming the electroluminescent layer. The anode 219 may be irradiated with an ultraviolet ray before or after the vacuum bake.

Figure 6B:
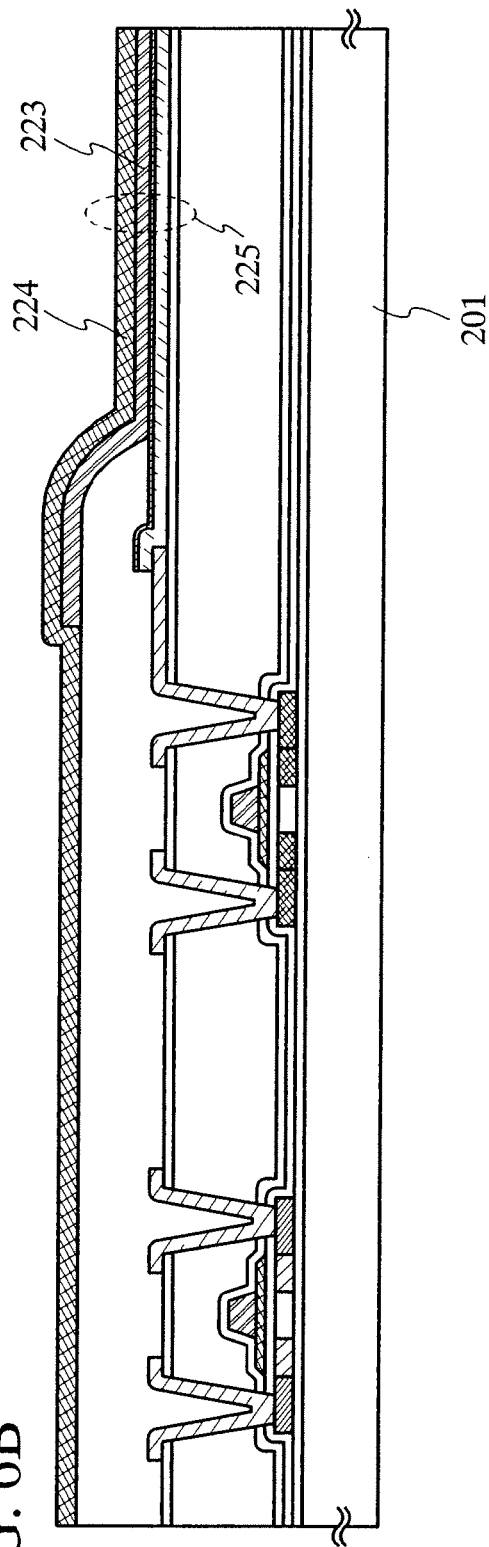

Next, as shown in FIG. 6B, an electroluminescent layer 223 is formed on the anode 219. The electroluminescent layer 223 includes one or a plurality of layers and each layer may include not only an organic material but also an inorganic material. The above explanation about FIGS. 4A and 4B can be referred to for the detail of the structure of the electroluminescent layer 223. Subsequently, the cathode 224 is formed so as to cover the electroluminescent layer 223. The anode 219, the electroluminescent layer 223, and the cathode 224 overlap in the opening of the barrier 222. The region in which these overlap corresponds to a light-emitting element 225.

After forming the light-emitting element 225, a protective film may be formed on the cathode 224. The film that is hard to transmit the material to promote the deterioration of the light-emitting element such as moisture or oxygen compared to another insulating film is used as the protective film as well as the second interlayer insulating film 212. Typically, it is desirable to use the DLC film, a carbon nitride film, a silicon nitride film formed by the RF sputtering method, or the like. Moreover, the above-mentioned film, which is hard to transmit the moisture or oxygen, and a film that transmits the moisture or oxygen more easily than the above film can be laminated and used as the protective film.

Although FIG. 6B shows the structure in which the light emitted from the light-emitting element is irradiated to the side of the substrate 201, the light-emitting element may have the structure in which the light is emitted to the side opposite to the substrate.

It is noted that after the light-emitting device shown in FIG. 6B is obtained, it is preferable to package (enclose) the light-emitting device using a protective film (laminated film, ultraviolet curable resin film, or the like) or a light-transmitting cover member that is highly airtight and hardly degasses. The reliability of the light-emitting element is enhanced when the inside of the cover member is filled with the inert atmosphere or the material having moisture-absorption characteristic (barium oxide, for example) is set in the cover member.

The method for manufacturing a light-emitting device of the present invention is not limited to that shown above. This embodiment mode explains just one example of the manufacturing method of the present invention, and various changes can be made within the scope of the present invention.

[Embodiment 1]

The present embodiment explains an example of a pixel of the light-emitting device obtained by the manufacturing method of the present invention.

Figure 8:
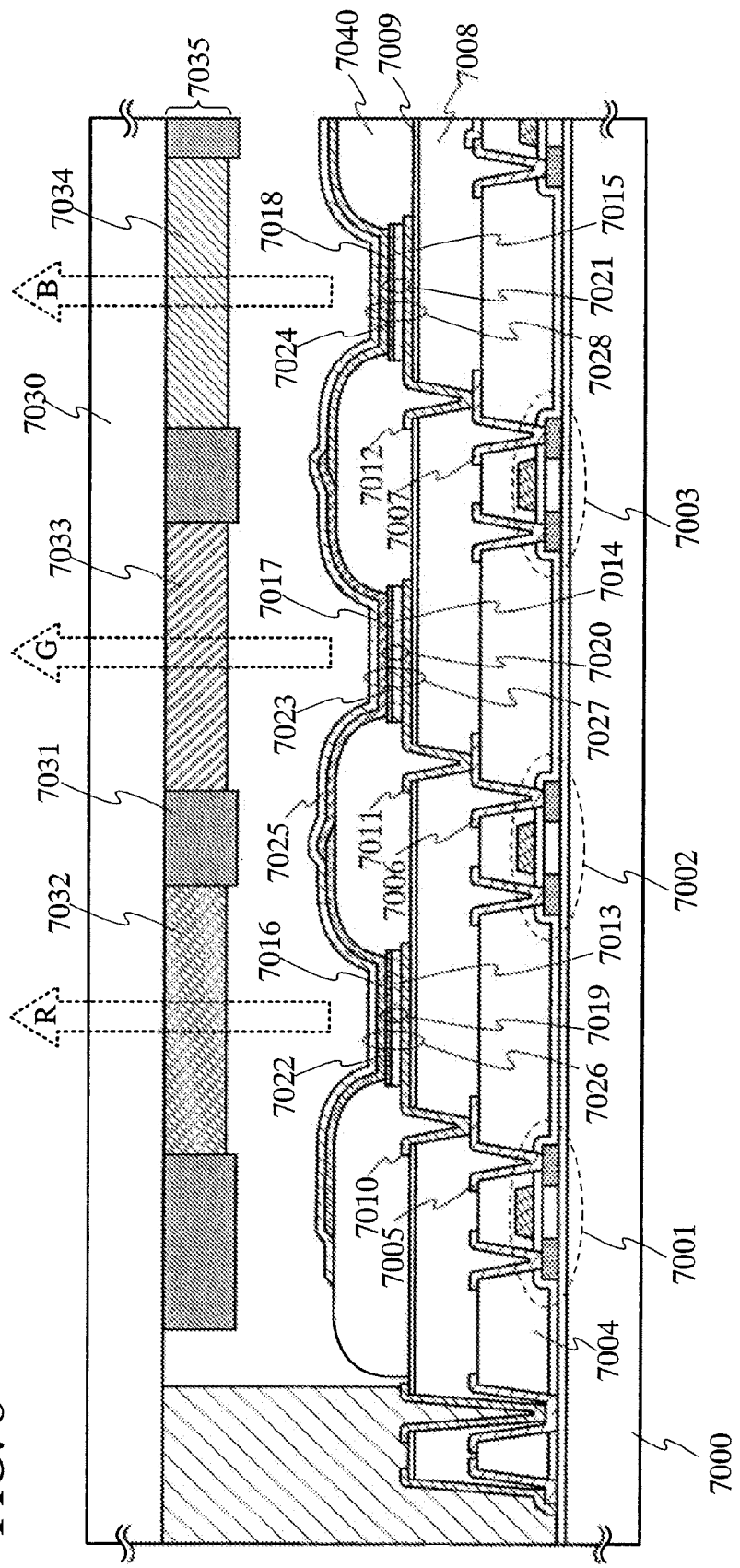
FIG. 8 is a cross-sectional view of the light-emitting device manufactured by the present invention.

FIG. 8 is a cross-sectional view of the light-emitting device explained in the present embodiment. In FIG. 8, transistors 7001 to 7003 are formed over a substrate 7000. The transistors 7001 to 7003 are covered by a first interlayer insulating film 7004. Wirings 7005 to 7007 connecting with the transistors 7001 to 7003 through the contact hole are formed on the first interlayer insulating film 7004.

A second interlayer insulating film 7008 and a third interlayer insulating film 7009 are laminated over the first interlayer insulating film 7004 so as to cover the wirings 7005 to 7007. It is noted that the organic resin film, the inorganic insulating film, the insulating film including Si—O bond and Si—$CH_x$ bond made from the material selected from the siloxane group, or the like can be used as the material of the first interlayer insulating film 7004 and the second interlayer insulating film 7008. In this embodiment, a non-photosensitive acrylic is used. A film that is hard to transmit the material to promote the deterioration of the light-emitting element such as moisture or oxygen compared to another insulating film is used as the material of the third interlayer insulating film 7009. Typically, it is desirable to use the DLC film, the carbon nitride film, the silicon nitride film formed by the RF sputtering method, or the like.

Wirings 7010 to 7012 connected electrically with the wirings 7005 to 7007 through the contact hole are formed on the third interlayer insulating film 7009. The wirings 7010 to 7012 are formed of the material through which the light does not transmit. Conductive light-transmitting oxide layers 7013 to 7015 and barrier layers 7016 to 7018 are laminated over the wirings 7010 to 7012. A part of the wirings 7010 to 7012, the conductive light-transmitting oxide layers 7013 to 7015, and the barrier layers 7016 to 7018 form anodes 7019 to 7021.

In FIG. 8, since the anodes 7019 to 7021 and the wirings 7010 to 7012 connected directly to the TFT are formed in the different layer, it is possible to enlarge the square measure of the layout of the anodes 7019 to 7021 and therefore to enlarge the region of the light-emitting element from which the light is obtained.

Moreover, a barrier 7040 is formed using an insulating film including Si—O bond and Si—$CH_x$ bond made from the material selected from the siloxane group, the organic resin film, the inorganic insulating film, or the like on the third interlayer insulating film 7009. The barrier 7040 has an opening, and light-emitting elements 7026 to 7028 are formed by overlapping the anodes 7019 to 7021, the electroluminescent layers 7022 to 7024, and the cathode 7025 in the opening. The electroluminescent layers 7022 to 7024 have a structure in which a plurality of layers is laminated. The cathode 7025 is formed of the material through which the light can transmit or in the thickness of such a degree that the light transmits. A protective film may be formed over the barrier 7040 and the cathode 7025.

A reference numeral 7030 denotes a light-transmitting cover member for sealing the light-emitting elements 7026 to 7028. A color filter 7035 having a blocking film 7031 for blocking the visible light and having coloring layers 7032 to 7034 corresponding to the pixel of each color is formed on the cover member 7030. In FIG. 8, the light in the red wavelength region among the light emitted from the light-emitting element 7026 transmits through the coloring layer 7032 selectively. The light in the green wavelength region among the light emitted from the light-emitting element 7027 transmits through the coloring layer 7033 selectively. The light in the blue wavelength region among the light emitted from the light-emitting element 7028 transmits through the coloring layer 7034 selectively.

In FIG. 8, the blocking film 7031 is formed in such a way that black pigment and drying agent are diffused in the resin. With the above structure, the deterioration of the light-emitting element can be prevented.

The blocking film 7031 is provided between the light-emitting elements 7026 and 7027 and between the light-emitting elements 7027 and 7028. The blocking film 7031 prevents the light generated in the light-emitting element from transmitting through the coloring layer of the adjacent pixels.

Although FIG. 8 explains the electroluminescent layers 7022 to 7024 each of which includes different electroluminescent material or has different element structure in every pixel corresponding to each color, the present invention is not limited to this. The electroluminescent layers each of which includes different electroluminescent material or has different element structure at least in the pixels corresponding to two colors may be used.

The color filter can enhance colorimetric purity of the light extracted from the pixel even though the colorimetric purity of the light emitted from each light-emitting element is low to some extent. It is desirable that the spectrum of the light emitted from the light-emitting element has comparatively higher peak in the wavelength region of the corresponding color than in the other wavelength regions. For example, in the case of the pixel of the red color, it is preferable that the spectrum of the light emitted from the light-emitting element has comparatively high peak in the red wavelength region. With the above structure, the amount of blocked light can be suppressed in every pixel of each color. Therefore, the light can be extracted efficiently compared to the case using the light-emitting element of white color.

The airtight space formed between the cover member 7030 and the substrate 7000 is filled with the inert gas or resin, or the material having moisture-absorption characteristic (such as barium oxide) may be set in the space.

Although the color filter is provided on the cover member in FIG. 8, the present invention is not limited to this structure. For example, the coloring layer maybe formed so as to overlap the light-emitting element by a droplet discharging method or the like. In this case, the resin can be used instead of the cover member. When the resin is used to seal the light-emitting element, the light extraction efficiency can be enhanced compared to the case where the cover member is provided.

It is noted that the light-emitting device of the present invention can be manufactured not only by the above manufacturing method but also by a known method.

[Embodiment 2]

Figure 9A:
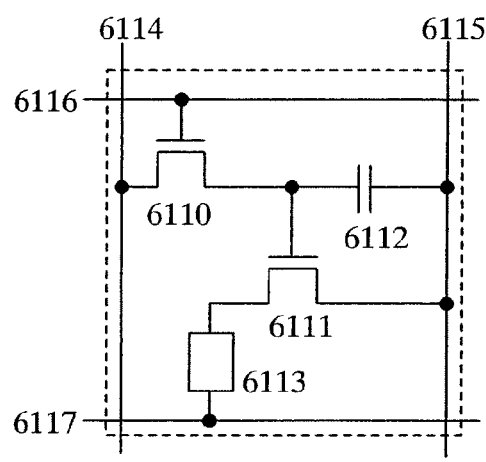
FIGS. 9A to 9C are circuit diagrams of the pixel of the light-emitting device.
Figure 9B:
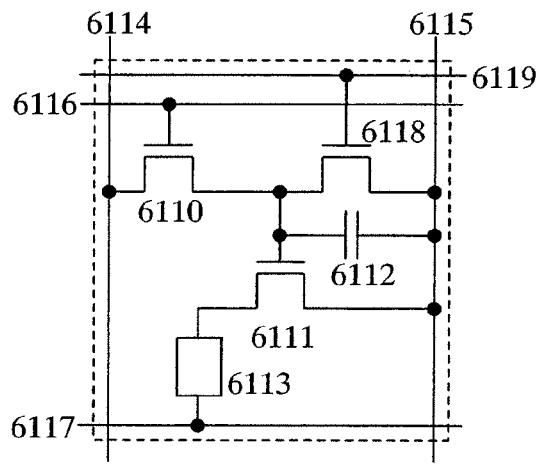
Figure 9C:
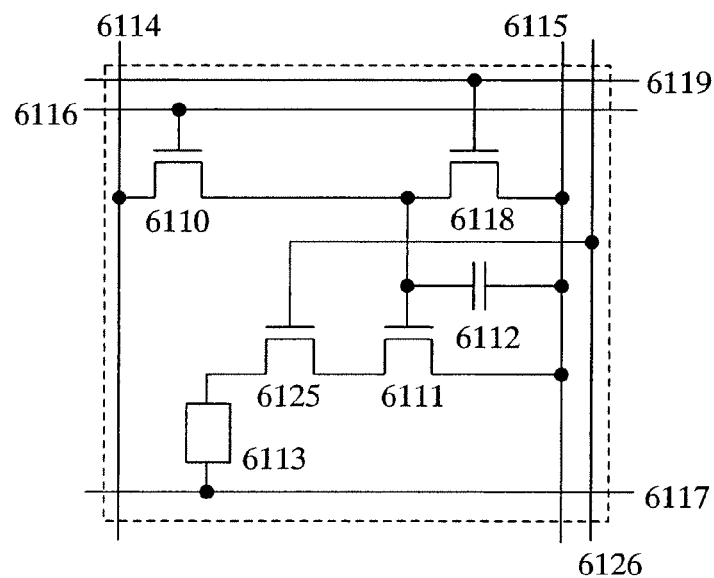

This embodiment explains a circuit diagram of a pixel of a light-emitting device manufactured by the present invention with reference to FIGS. 9A to 9C. FIG. 9A is an equivalent circuit diagram of the pixel showing a signal line 6114, power supply lines 6115 and 6117, a scanning line 6116, a light-emitting element 6113, a TFT 6110 for controlling the input of a video signal into the pixel, a TFT 6111 for controlling the current value flowing between both electrodes of the light-emitting element 6113, and a capacitance element 6112 for holding the voltage between the gate and the source of the TFT 6111. Although FIG. 5B shows the capacitance element 6112, the capacitance element 6112 is not necessary when the gate capacitance of the TFT 6111 or another parasitic capacitance is enough.

FIG. 9B is a pixel circuit having the structure in which a TFT 6118 and a scanning line 6119 are newly provided in the pixel shown in FIG. 9A. The TFT 6118 makes it possible to make the condition compellingly in which the current does not flow in the light-emitting element 6113. Thus, the lighting period can start at the same time as or just after the start of the writing period without waiting the writing of the signal to all the pixels. Therefore, the duty ratio increases and particularly the display of the moving image can be improved.

FIG. 9C is a pixel circuit in which a TFT 6125 and a wiring 6126 are provided in the pixel shown in FIG. 9B. In this structure, a gate electrode of the TFT 6125 is connected to the wiring 6126 with the potential kept constant so that the potential of this gate electrode is fixed and that the TFT 6125 is operated in a saturated region. A video signal for conveying the information of lightening or not lightening of the pixel is input through the TFT 6110 into a gate electrode of the TFT 6111 that is connected to the TFT 6125 serially and that operates in a linear region. Since the voltage value between the source and the drain of the TFT 6111 operating in the linear region is low, the slight fluctuation of the voltage between the source and the drain of the TFT 6111 does not affect the current value flowing in the light-emitting element 6113. Therefore, the current value flowing in the light-emitting element 6113 is determined by the TFT 6125 operating in the saturated region. In the present invention having the above structure, the image quality can be enhanced by improving the inhomogeneous luminance of the light-emitting element 6113 due to the variation in the characteristic of the TFT 6125. It is preferable that $L_1/W_1:L_2/W_2=5$ to 6000:1 is satisfied when the channel length of the TFT 6125 is $L_1$, the channel width thereof is $W_1$, the channel length of TFT 6111 is $L_2$, and the channel width thereof is $W_2$. Moreover, it is preferable that both TFTs have the same conductivity type in the manufacturing step. As the TFT 6125, not only an enhancement type but also a depletion type may be used.

One of an analog video signal and a digital video signal may be used in the light-emitting device formed by the present invention. In the digital video signal, there are a video signal using the voltage and a video signal using the current. In other words, the video signal input into the pixel uses the constant voltage or the constant current when the light-emitting element emits light. When the video signal uses the constant voltage, the voltage applied to the light-emitting element or the current flowing in the light-emitting element is constant. On the other hand, when the video signal uses the constant current, the voltage applied to the light-emitting element or the current flowing in the light-emitting element is constant. The former one in which the constant voltage is applied to the light-emitting element is referred to as a constant voltage drive, while the latter one in which the constant current flows in the light-emitting element is referred to as a constant current drive. The constant current flows in the light-emitting element driven by the constant current without being affected by the change of the resistance of the light-emitting element. Either the video signal using the constant voltage or the video signal using the constant current may be used in the light-emitting device and its driving method. Moreover, the light-emitting device of the present invention may be used either by the constant voltage drive or by the constant current drive. The present embodiment can be freely combined with the embodiment mode and another embodiment.

[Embodiment 3]

Figure 10A:
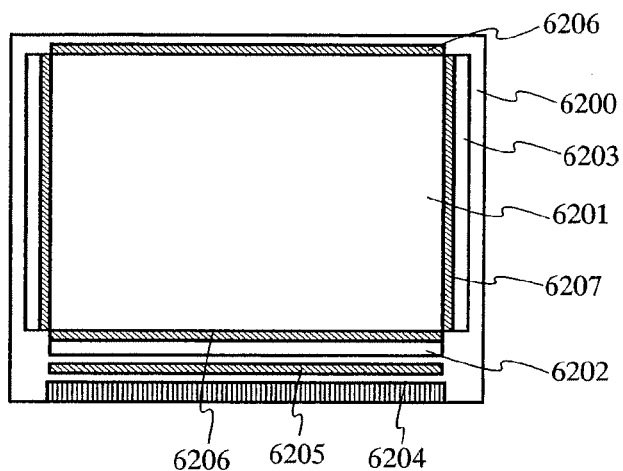
FIG. 10A is a top view of the light-emitting device.

The present embodiment explains a structure of a light-emitting device manufactured by the present invention with reference to FIGS. 10A to 10F. FIG. 10A is a top view of the light-emitting device for explaining the concept of the light-emitting device having a pixel portion 6201, a signal line driver circuit 6202, and a scanning line driver circuit 6203 over a substrate 6200. A reference numeral 6204 denotes an input terminal for supplying power source potential or a signal to each circuit formed over the substrate 6200. Reference numerals 6205 to 6207 denote protective circuits for preventing the semiconductor element from being damaged due to the noise of the signal, the electrostatic, or the like. It is not always necessary to provide all the protective circuits 6205 to 6207 and any one or a plurality of protective circuits among them may be provided.

Although the signal line driver circuit 6202 and the scanning line driver circuit 6203 are formed over the substrate 6200 where the pixel portion 6201 is formed, the present invention is not limited to this structure. For example, when an amorphous semiconductor or a micro-crystal semiconductor is used as a semiconductor element for forming the pixel portion 6201, the signal line driver circuit 6202 and the scanning line driver circuit 6203 formed separately may be mounted on the substrate 6200 by a known method such as a COG method or a TAB method. When the micro-crystal semiconductor is used as the semiconductor element for forming the pixel portion 6201, the scanning line driver circuit and the pixel portion may be formed of the micro-crystal semiconductor over the same substrate, and the signal line driver circuit may be mounted on this substrate. Moreover, a part of the scanning line driver circuit or a part of the signal line driver circuit is formed together with the pixel portion over the same substrate and then the other parts of the scanning line driver circuit or the other parts of the signal line driver circuit may be mounted on this substrate. In other words, there are various ways to form the driving circuit and any structure can be used in the present invention.

Next, an example of the protective circuits 6205 to 6207 used in the light-emitting device manufactured by the present invention is explained. The protective circuit is formed by one or a plurality of semiconductor elements selected from the group consisting of a TFT, a diode, a resistance element, a capacitance element, and the like. Hereinafter structures of several protective circuits and their operations are explained.

Figure 10B:
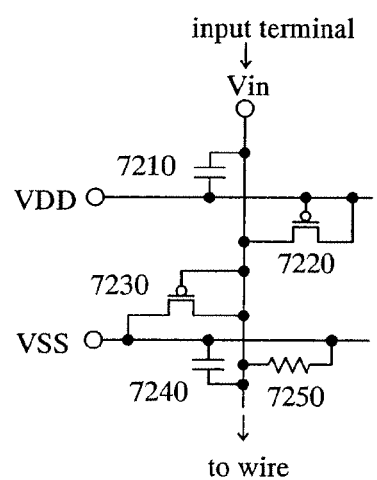
FIGS. 10B to 10F are circuit diagrams of the protective circuit.

First, a structure of the protective circuit 6205 provided between the input terminal and each circuit formed over the substrate is explained with reference to an equivalent circuit diagram in FIG. 10B. The protective circuit shown in FIG. 10B has p-channel TFTs 7220 and 7230, capacitance elements 7210 and 7240, and a resistance element 7250. The resistance element 7250 has two terminals. The input potential Vin given from the input terminal is given to one terminal and the low power source potential VSS is given to the other terminal. The resistance element 7250 is provided in order to lower the potential of the wiring to be VSS when the Vin is not given to the input terminal, and the resistance value of the resistance element 7250 is set so as to become much higher than that of the wiring.

According to the relation of the voltage between the gate and the source, the TFT 7220 is turned on and the TFT 7230 is turned off when Vin is higher than the high power source potential VDD. Then, VDD is given to the wiring through the TFT 7220. Therefore, even though Vin becomes higher than VDD due to the noise or the like, the potential given to the wiring does not become higher than VDD. On the other hand, according to the relation of the voltage between the gate and the source, the TFT 7220 is turned off and the TFT 7230 is turned on when Vin is lower than VSS. Then, VSS is given to the wiring. Therefore, even though Vin becomes lower than VSS due to the noise or the like, the potential given to the wiring does not become lower than VSS. Moreover, a pulsed noise can be reduced in the potential from the input terminal by the capacitance elements 7210 and 7240 and it is possible to suppress the sudden change of the potential due to the noise to some extent.

With the arrangement of the protective circuits in the above structure, the potential of the wiring is kept between VSS and VDD, and the circuit in the following line can be protected from the extremely high or extremely low potential out of this range. Moreover, by providing the protective circuit in the input terminal where the signal is input, the potential of all the wirings to which the signal is given can be kept constant (VSS here) when the signal is not input. In other words, the protective circuit has a function as a short ring to make the wirings shorted when the signal is not input. Therefore, the electrostatic damage due to the potential difference between the wirings can be prevented. Moreover, since the resistance value of the resistance element 7250 is high sufficiently when the signal is input, the signal given to the wiring is not affected by VSS.

Figure 10C:
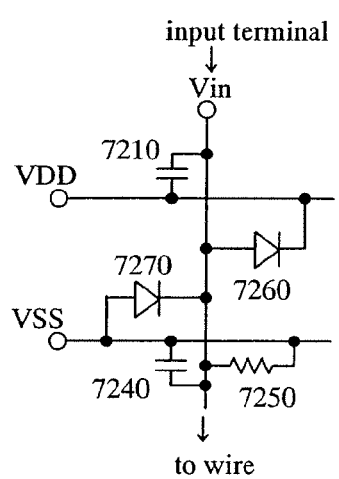
Figure 10D:
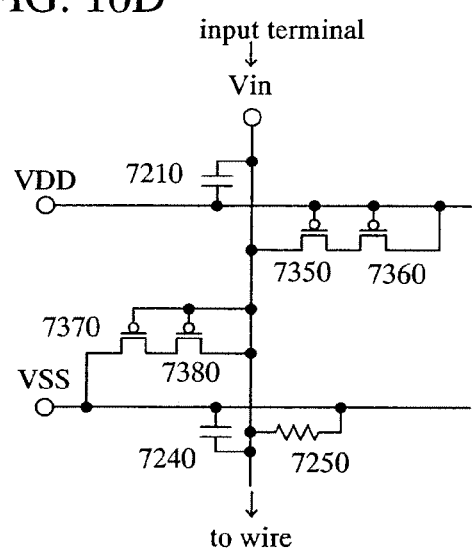
Figure 10E:
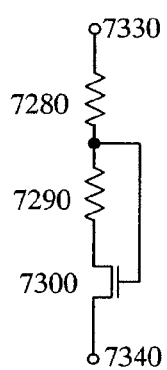
Figure 10F:
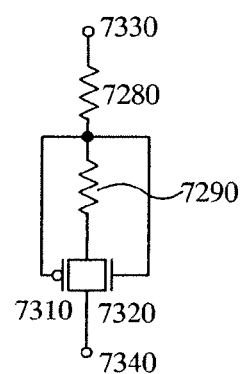

FIG. 10C is an equivalent circuit diagram of the protective circuit in which rectifier diodes 7260 and 7270 are used instead of the p-channel TFTs 7220 and 7230. FIG. 10D is an equivalent circuit diagram of the protective circuit in which TFTs 7350, 7360, 7370, and 7380 are used instead of the p-channel I's 7220 and 7230.

As a protective circuit having the structure different from that described above, protective circuits shown in FIGS. 10E and 10F are given. The protective circuit shown in FIG. 10E has resistances 7280, 7290, and an n-channel TFT 7300. The protective circuit shown in FIG. 10F has resistances 7280 and 7290, a p-channel TFT 7310, and an n-channel TFT 7320. In both structures of FIGS. 10E and 10F, the wiring and the like are connected to the terminal 7330, and the current flows in a direction from the terminal 7330 to the terminal 7340 by turning on the n-channel 7300 or by turning on the p-channel TFT 7310 and the n-channel TFT 7320 when the potential of this wiring and the like changes suddenly. Thus, it is possible to relax the sudden change of the potential connected to the terminal 7330 and to prevent the semiconductor element from deteriorating or being damaged. It is preferable that the semiconductor element of the protective circuit is formed of an amorphous semiconductor that is superior in resistance. The present embodiment can be freely combined with the above embodiment mode.

It is noted that the signal line driver circuit 6202 and the pixel portion 6201 are connected by the signal line and the protective circuit 6206 can prevent the potential of the signal line from changing suddenly due to the noise or the electrostatic. The scanning line driver circuit 6203 and the pixel portion 6201 are connected by the scanning line, and the protective circuit 6207 can prevent the potential of the scanning line from changing suddenly due to the noise or the electrostatic. The protective circuits 6206 and 6207 can have the circuit structure shown in any one of FIGS. 10B to 10F as well as the protective circuit 6205.

[Embodiment 4]

Figure 11A:
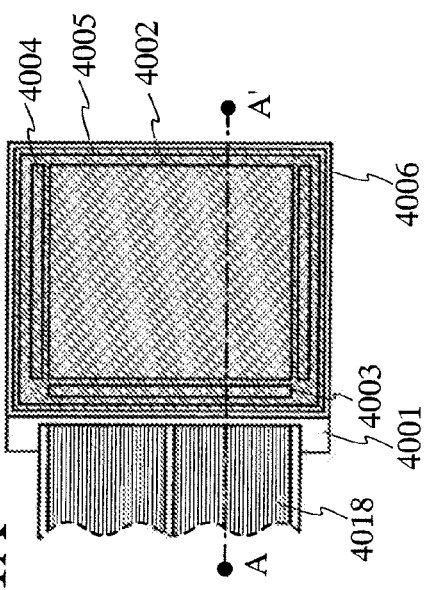
FIG. 11A is a top view of the light-emitting device of the present invention.
Figure 11B:
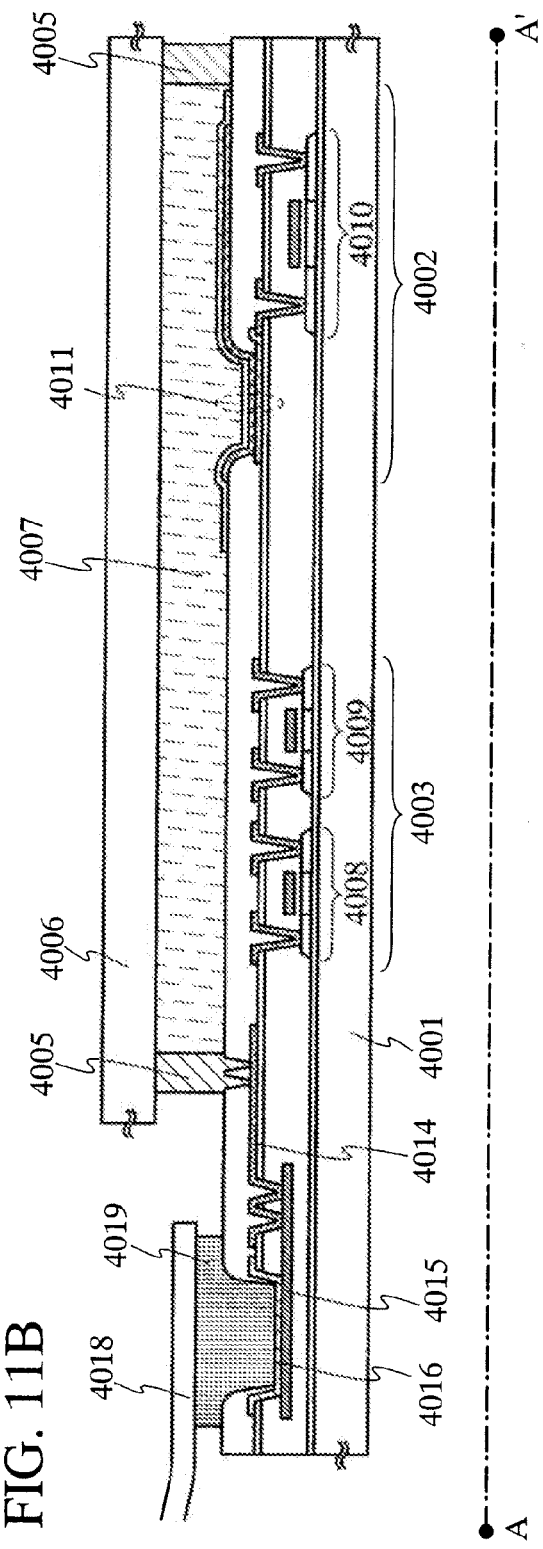
FIG. 11B is a cross-sectional view of the light-emitting device of the present invention.

This embodiment explains a panel, which is an example of a light-emitting device manufactured by the present invention, with reference to FIGS. 11A and 11B. FIG. 11A is a top view of the panel in which the transistor and the light-emitting element formed over the substrate are sealed between the substrate and the cover member by a sealing material. FIG. 11B is a side view taken along A-A' in FIG. 11A.

A sealing material 4005 is provided so as to surround a pixel portion 4002, a signal line driver circuit 4003, and a scanning line driver circuit 4004 all of which are formed over the substrate 4001. Moreover, a cover member 4006 is provided over the pixel portion 4002, the signal line driver circuit 4003, and the scanning line driver circuit 4004. Therefore, the pixel portion 4002, the signal line driver circuit 4003, and the scanning line driver circuit 4004 are sealed with a filler material 4007 by the substrate 4001, the sealing material 4005, and the cover member 4006.

The pixel portion 4002, the signal line driver circuit 4003, and the scanning line driver circuit 4004 all of which are formed over the substrate 4001 have a plurality of transistors, and FIG. 11B shows transistors 4008 and 4009 in the signal line driver circuit 4003 and a transistor 4010 in the pixel portion 4002.

A reference numeral 4011 denotes a light-emitting element, which is connected electrically to the transistor 4010.

The lead wiring 4014 is a wiring for supplying a signal or power supply voltage to the pixel portion 4002, the signal line driver circuit 4003, and the scanning line driver circuit 4004. The lead wiring 4014 is connected to a connection terminal 4016 through the lead wiring 4015. The connection terminal 4016 is connected electrically to the terminal in an FPC 4018 through an anisotropic conductive film 4019.

As the substrate 4001, not only glass, metal (typically stainless), and ceramic but also flexible material typified by plastic can be used. As the plastic, an FRP (Fiberglass-Reinforced Plastics) plate, a PVF (polyvinylfluoride) film, a mylar film, a polyester film, or an acrylic resin film can be used. Moreover, a sheet in which an aluminum foil is sandwiched by the PVF film or the mylar film can be used. The cover member 4006 is formed of the light-transmitting material such as a glass plate, a plastic plate, a polyester film, or an acrylic film.

As the filler material 4007, not only inert gas such as nitrogen or argon but also ultraviolet curable resin or thermoset resin can be used. For example, PVC (polyvinylchloride), acrylic, polyimide, epoxy resin, silicon resin, PVB (polyvinylbutyral), or EVA (ethylene vinyl acetate) can be used. Nitrogen is used as the filler material in this embodiment.

The filler material 4007 may be exposed to the material having the moisture-absorption characteristic (preferably barium oxide) or the material that can absorb the oxygen.

[Embodiment 5]

In the light-emitting device of the present invention, the external quantum efficiency is high in spite of the low power consumption and the contrast of the image can be enhanced. Therefore, even when the outside light such as sunlight is irradiated, the clear image can be displayed while suppressing the power consumption, and therefore the light-emitting device of the present invention has an advantageous effect that it can be used in any place. For this reason, the present invention is suitable not only for the television but also for a mobile electronic equipment.

Figure 12A:
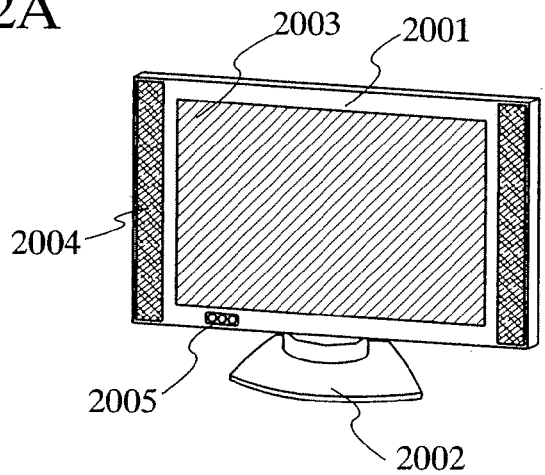
FIGS. 12A to 12C are drawings of the electronic equipments of the light-emitting device.
Figure 12B:
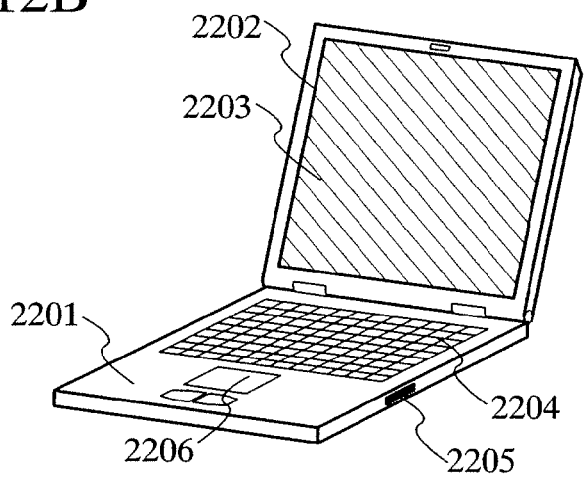
Figure 12C:
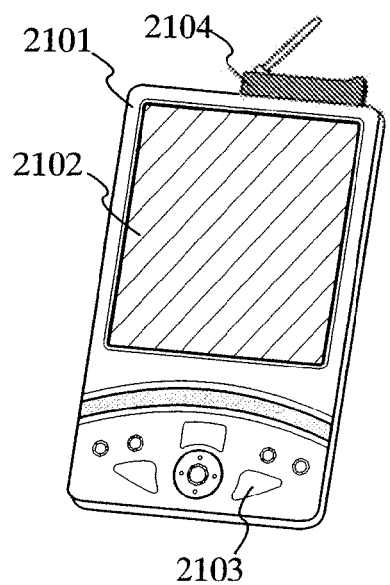

Specifically, as the electronic equipment using the light-emitting device of the present invention, there are a video camera, a digital camera, a goggle type display (head mount display), a navigation system, a sound reproduction device (car audio, an audio compo, and the like), a note type personal computer, a game machine, a mobile terminal device (mobile computer, mobile phone, mobile game machine, an electronic book, or the like), an image reproduction device with a recording medium equipped (specifically, a device for playing a recording medium such as DVD (Digital Versatile Disc) and for displaying the image), and the like. FIGS. 12A to 12C show the examples of these electronic equipments.

FIG. 12A is a display device including a chassis 2001, a supporting stand 2002, a display portion 2003, a speaker portion 2004, a video input terminal 2005, and the like. The light-emitting device of the present invention can be used as the display portion 2003. Since the light-emitting device emits the light by itself, the backlight is not necessary and therefore the display portion can be made thinner than a liquid crystal display. The display device using the light-emitting element includes all the display devices for displaying information such as the display device for a personal computer, for TV broadcast receiving, or for displaying an advertisement.

FIG. 12B is a note-type personal computer including a main body 2201, a chassis 2202, a display portion 2203, a keyboard 2204, an external connection port 2205, a mouse 2206, and the like. The light-emitting device of the present invention can be used as the display portion 2203.

FIG. 12C is a personal digital assistant (PDA) including a main body 2101, a display portion 2102, an operation key 2103, a modem 2104, and the like. The modem 2104 may be incorporated in the main body 2101. The light-emitting device of the present invention can be used as the display portion 2102.

As above, the present invention can be applied in a wide range and can be applied to various kinds of electronic equipments. In addition, the electronic equipments of this embodiment may have the light-emitting device having any structure shown in the embodiments 1 to 4.

[Embodiment 6]

A transistor used in the light-emitting device of the present invention may be a TFT using a poly-crystalline semiconductor or may be a TFT using an amorphous semiconductor or a semi-amorphous semiconductor. This embodiment explains a structure of the TFT formed using the amorphous semiconductor or the semi-amorphous semiconductor.

FIG. 7A is a cross-sectional view of the TFT used in a driving circuit and a cross-sectional view of the TFT used in a pixel portion. A reference numeral 1001 denotes a cross section of the TFT used in the driving circuit, a reference numeral 1002 denotes a cross section of the TFT used in the pixel portion, and a reference numeral 1003 denotes a cross section of a light-emitting element to which the current is supplied by the TFT 1002. The TFTs 1001 and 1002 are inversely staggered (bottom-gate type) TFTs.

The TFT 1001 in the driving circuit includes a gate electrode 1010 over a substrate 1000, a gate insulating film 1011 covering the gate electrode 1010, and a first semiconductor film 1012 formed of the semi-amorphous semiconductor or the amorphous semiconductor that overlaps the gate electrode 1010 with the gate insulating film 1011 interposed therebetween. Moreover, the TFT 1001 has a pair of second semiconductor films 1013 functioning as a source region or a drain region and a third semiconductor film 1014 provided between the first semiconductor film 1012 and the second semiconductor film 1013.

Although the gate insulating film 1011 is formed of two layers of insulating film in FIG. 7A, the present invention is not limited to this structure. The gate insulating film 1011 may be formed of a single layer or three or more layers of the insulating film.

The second semiconductor film 1013 is formed of the amorphous semiconductor or the semi-amorphous semiconductor, and an impurity imparting one conductivity type is added to the second semiconductor film 1013. The pair of second semiconductor films 1013 is provided oppositely with a region in the first semiconductor film 1012 where a channel is formed interposed therebetween.

The third semiconductor film 1014 is formed of the amorphous semiconductor or the semi-amorphous semiconductor. The third semiconductor film 1014 has the same conductivity type as the second semiconductor film 1013 and has the characteristic that the conductivity thereof is lower than that of the second semiconductor film 1013. Since the third semiconductor film 1014 works as the LDD region, the electric field concentrated in the end portion of the second semiconductor film 1013 functioning as the drain region can be relaxed and the hot carrier effect can be prevented. Although the third semiconductor film 1014 is not always necessary, the provision of the third semiconductor film 1014 can improve the withstand voltage of the TFT and can enhance the reliability. When the TFT 1001 is n-type, the third semiconductor film 1014 can have n-type conductivity without adding the impurity imparting n-type in particular when forming the third semiconductor film 1014. Therefore, when the TFT 1001 is n-type, the impurity imparting n-type does not always have to be added to the third semiconductor film 1014. However, an impurity imparting p-type conductivity is added to the first semiconductor film where the channel is formed and the conductivity type is controlled so as to approach I-type as much as possible.

Two wirings 1015 are formed so as to contact the pair of second semiconductor films 1013.

The TFT 1002 in the driving circuit includes a gate electrode 1020 over the substrate 1000, a gate insulating film 1011 covering the gate electrode 1020, and a first semiconductor film 1022 formed of the amorphous semiconductor or the semi-amorphous semiconductor that overlaps the gate electrode 1020 with the gate insulating film 1011 interposed therebetween. Moreover, the TFT 1002 has a pair of second semiconductor films 1023 functioning as a source region or a drain region and a third semiconductor film 1024 provided between the first semiconductor film 1022 and the second semiconductor film 1023.

The second semiconductor film 1023 is formed of the amorphous semiconductor or the semi-amorphous semiconductor, and the impurity imparting one conductivity type is added to the second semiconductor film 1023. The pair of second semiconductor films 1023 is provided oppositely with a region in the first semiconductor film 1022 where the channel is formed interposed therebetween.

The third semiconductor film 1024 is formed of the amorphous semiconductor or the semi-amorphous semiconductor. The third semiconductor film 1024 has the same conductivity type as the second semiconductor film 1023 and has the characteristic that the conductivity thereof is lower than that of the second semiconductor film 1023. Since the third semiconductor film 1024 works as the LDD region, the electric field concentrated in the end portion of the second semiconductor film 1023 functioning as the drain region can be relaxed and the hot carrier effect can be prevented. Although the third semiconductor film 1024 is not always necessary, the provision of the third semiconductor film 1024 can improve the withstand voltage of the TFT and can enhance the reliability. When the TFT 1002 is n-type, the third semiconductor film 1024 can have n-type conductivity without adding the impurity imparting n-type in particular when forming the third semiconductor film 1024. Therefore, when the TFT 1002 is n-type, the impurity imparting n-type does not always have to be added to the third semiconductor film 1024. However, an impurity imparting p-type conductivity is added to the first semiconductor film where the channel is formed, and the conductivity type is controlled so as to approach I-type as much as possible.

Moreover, a wiring 1025 is formed so as to contact the pair of second semiconductor films 1023.

In addition, a first passivation film 1040 and a second passivation film 1041 are formed of the insulating film so as to cover the TFTs 1001 and 1002 and the wirings 1015 and 1025. The passivation film covering the TFTs 1001 and 1002 may have not only two layers but also a single layer or three or more layers. For example, the first passivation film 1040 can be formed of silicon nitride and the second passivation film 1041 can be formed of silicon oxide. When the passivation film is formed of the silicon nitride or the silicon nitride oxide, it is possible to prevent the TFTs 1001 and 1002 from deteriorating due to the moisture or oxygen.

One of the wirings 1025 is connected to the anode 1030 of the light-emitting element 1003. Moreover, an electroluminescent layer 1031 is formed so as to contact on the anode 1030 and a cathode 1032 is formed so as to contact on the electroluminescent layer 1031.

The anode 1030 has a conductive light-transmitting oxide layer 1030a and a barrier layer 1030b, and the barrier 1030b contacts the electroluminescent layer 1031.

Next, another example of a TFT in the light-emitting device of the present invention that is different from the TFT shown in FIG. 7A is explained. FIG. 7B is a cross-sectional view of the TFT used in the driving circuit and a cross-sectional view of a TFT used in the pixel portion. A reference numeral 1101 denotes a cross section of the TFT used in the driving circuit, a reference numeral 1102 denotes a cross section of the TFT used in the pixel portion, and a reference numeral 1103 denotes a cross section of a light-emitting element to which the current is supplied by the TFT 1102.

The TFT 1101 in the driving circuit and the TFT 1102 in the pixel portion respectively include gate electrodes 1110 and 1120 over a substrate 1100, a gate insulating film 1111 covering the gate electrodes 1110 and 1120, and first semiconductor films 1112 and 1122 formed of the amorphous semiconductor or the semi-amorphous semiconductor that overlap the gate electrodes 1110 and 1120 with the gate insulating film 1111 interposed therebetween. Channel protective films 1133 and 1134 are formed of the insulating film so as to cover the channel-forming region of the first semiconductor films 1112 and 1122. The channel protective films 1133 and 1134 are provided in order to prevent the channel-forming regions of the first semiconductor films 1112 and 1122 from being etched in the process for manufacturing the TFTs 1101 and 1102. Moreover, the TFT 1101 has a pair of second semiconductor films 1113 and has a third semiconductor film 1114 provided between the first semiconductor film 1112 and the second semiconductor film 1113. The TH 1102 has a pair of second semiconductor films 1123 and has a third semiconductor film 1124 provided between the first semiconductor film 1122 and the second semiconductor film 1123.

Although the gate insulating film 1111 is formed of two layers of insulating film in FIG. 7B, the present invention is not limited to this structure. The gate insulating film 1111 may be formed of a single layer or three or more layers of the insulating film.

The second semiconductor films 1113 and 1123 are formed of the amorphous semiconductor or the semi-amorphous semiconductor, and an impurity imparting one conductivity type is added to the second semiconductor films 1113 and 1123. The respective pairs of second semiconductor films 1113 and 1123 are formed oppositely with a region in the first semiconductor films 1112 and 1122 where a channel is formed interposed therebetween.

The third semiconductor films 1114 and 1124 are formed of the amorphous semiconductor or the semi-amorphous semiconductor. The third semiconductor films 1114 and 1124 have the same conductivity type as the second semiconductor films 1113 and 1123 and have the characteristic that the conductivity thereof is lower than that of the second semiconductor films 1113 and 1123. Since the third semiconductor films 1114 and 1124 work as the LDD region, the electric field concentrated in the end portion of the second semiconductor films 1113 and 1123 functioning as the drain region can be relaxed and the hot carrier effect can be prevented. Although the third semiconductor films 1114 and 1124 are not always necessary, the provision of the third semiconductor films 1114 and 1124 can improve the withstand voltage of the TFT and can enhance the reliability. When the TFTs 1101 and 1102 are n-type, the third semiconductor films 1114 and 1124 can have n-type conductivity without adding the impurity imparting n-type when forming the third semiconductor films 1114 and 1124. Therefore, when the TFTs 1101 and 1102 are n-type, the impurity imparting n-type does not always have to be added to the third semiconductor films 1114 and 1124. However, an impurity imparting p-type conductivity is added to the first semiconductor film where the channel is formed and the conductivity type is controlled so as to approach I-type as much as possible.

Two wirings 1115 are formed so as to contact the pair of second semiconductor films 1113, and two wirings 1125 are formed to contact the pair of second semiconductor films 1123.

A first passivation film 1140 is formed of the insulating film so as to cover the TFT 1101 and the wiring 1115. A second passivation film 1141 is formed of the insulating film so as to cover the TFT 1102 and the wiring 1125. The passivation films covering the TFTs 1101 and 1102 may have not only two layers but also a single layer or three or more layers. For example, the first passivation film 1140 can be formed of silicon nitride and the second passivation film 1141 can be formed of silicon oxide. When the passivation film is formed of the silicon nitride or the silicon nitride oxide, it is possible to prevent the TFTs 1101 and 1102 from deteriorating due to the moisture or oxygen.

One of the wirings 1125 is connected to the anode 1130 of the light-emitting element 1103. Moreover, an electroluminescent layer 1131 is formed so as to contact on the anode 1130 and a cathode 1132 is formed so as to contact the electroluminescent layer 1131.

The anode 1130 has a conductive light-transmitting oxide layer 1130a and a barrier layer 1130b, and the barrier layer 1130b contacts the electroluminescent layer 1134.

Although this embodiment explains an example where the driving circuit and the pixel portion of the light-emitting device are formed over the same substrate using the TFT formed by the amorphous semiconductor or the semi-amorphous semiconductor, the present invention is not limited to this. The pixel portion may be formed over a substrate by the TFT using the amorphous semiconductor or the semi-amorphous semiconductor and a driving circuit formed separately may be pasted to the substrate with the pixel portion formed.

Figure 13A:
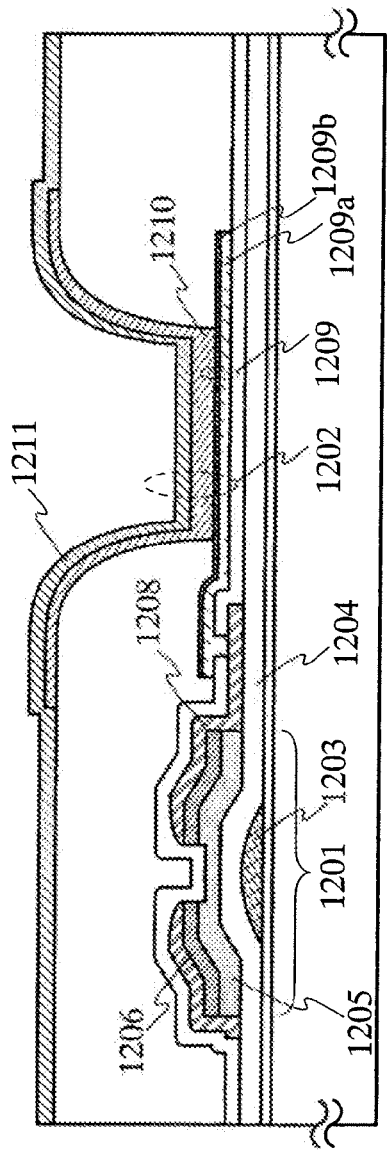
FIGS. 13A and 13B are cross-sectional views of the light-emitting device of the present invention.

Moreover, the gate electrode and the wiring may be formed by the droplet discharging method. FIG. 13A shows a cross section of the pixel formed by the droplet discharging method as an example. In FIG. 13A, a reference numeral 1201 denotes a bottom-gate TFT, which is connected electrically to the light-emitting element 1202. The TFT 1201 has a gate electrode 1203, a gate insulating film 1204 formed on the gate electrode 1203, a first semiconductor film 1205 formed on the gate insulating film 1204, and a second semiconductor film 1206 formed on the first semiconductor film 1205. It is noted that the first semiconductor film 1205 functions as the channel-forming region. An impurity imparting conductivity type is added to the second semiconductor film 1206, which functions as a source region or a drain region.

The wiring 1208 is formed so as to contact the second semiconductor film 1206, and the wiring 1208 is connected to the anode 1209 in the light-emitting element 1202. In addition, the light-emitting element 1202 has an anode 1209, an electroluminescent layer 1210 formed on the anode 1209, and a cathode 1211 formed on the electroluminescent layer 1210.

The anode 1209 has a conductive light-transmitting oxide layer 1209a and the barrier layer 1209b.

In the light-emitting device shown in FIG. 13A, the gate electrode 1203, the wiring 1208, the anode 1209, the electroluminescent layer 1210, a mask used for patterning, and the like can be formed by the droplet discharging method.

Figure 13B:
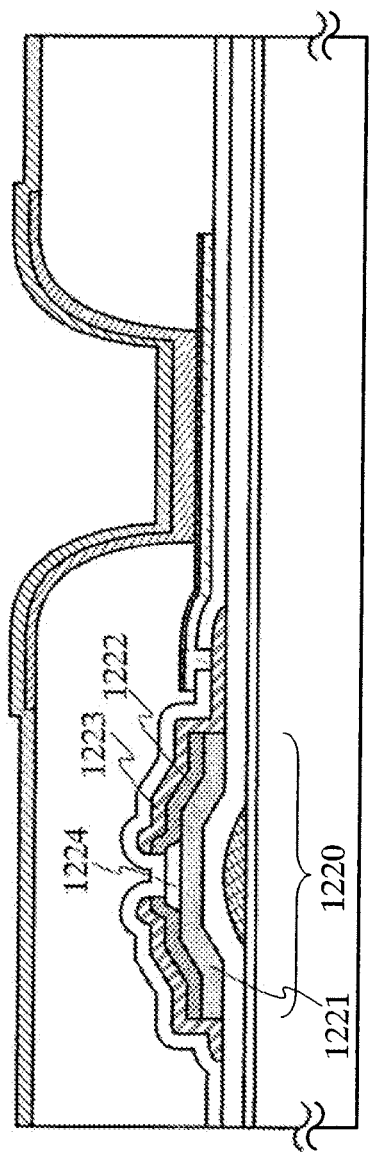

FIG. 13B shows a cross section of the pixel formed by the droplet discharging method as an example. In FIG. 13B, an insulating film (etching stopper) 1224 is formed on the first semiconductor film 1221 of the bottom-gate type TFT 1220 for the purpose of preventing the first semiconductor film 1221 from being etched when patterning the second semiconductor film 1222 and the wiring 1223.

[Embodiment 7]

This embodiment explains a combination of an insulating film and an anode formed on the insulating film.

FIG. 14A shows the measured value of the current efficiency η (cd/A) to the luminance L (cd/m$^2$) of the light-emitting element in which the insulating film is formed of the silicon nitride oxide and in which the anode is formed using ITSO including the silicon oxide for 5 wt. % on the insulating film. In order to compare, FIG. 14A also shows the measured value of the current efficiency η (cd/A) to the luminance L (cd/m$^2$) of the light-emitting element in which the insulating film is formed of the silicon nitride oxide and in which the anode is formed using ITO on the insulating film.

The sample used in the measurement shown in FIG. 14A has a structure in which an insulating film using the silicon nitride oxide is formed on another insulating film having a thickness of 0.8 μm including Si—O bond and Si—CH$_x$ bond made of the material selected from the siloxane group. The insulating film using silicon nitride oxide is formed in 100 nm thick by a CVD method.

As shown in FIG. 14A, it has been confirmed that the sample using the ITSO as the anode has higher current efficiency than the sample using the ITO as the anode.

Next, FIG. 14B shows the measured value of the current efficiency η (cd/A) to the luminance L (cd/m$^2$) of the light-emitting element in which the insulating film is formed of the silicon nitride and in which the anode is formed using ITSO including the silicon oxide for 5 wt. % on the insulating film. In order to compare, FIG. 14B also shows the measured value of the current efficiency η (cd/A) to the luminance L (cd/m$^2$) of the light-emitting element in which the insulating film is formed of the silicon nitride and in which the anode is formed using ITO on the insulating film.

The sample used in the measurement shown in FIG. 14B has a structure in which an insulating film using the silicon nitride is formed on another insulating film having a thickness of 0.8 μm including acrylic. The insulating film using silicon nitride is formed in 100 nm thick by a sputtering method.

As shown in FIG. 14B, it has been confirmed that the sample using the ITSO as the anode has higher current efficiency than the sample using the ITO as the anode as well as in FIG. 14A.

Next, FIG. 14C shows the measured value of the current efficiency η (cd/A) to the luminance L (cd/m$^2$) of the light-emitting element in which the insulating film is formed of the silicon oxide and in which the anode is formed using ITSO including the silicon oxide for 5 wt. % on the insulating film. In order to compare, FIG. 14C also shows the measured value of the current efficiency η (cd/A) to the luminance L (cd/m$^2$) of the light-emitting element in which the insulating film is formed of the silicon oxide and in which the anode is formed using ITO on the insulating film.

In the sample used in the measurement shown in FIG. 14C, the insulating film is formed using the silicon oxide in 100 nm thick.

When FIGS. 14A, 14B, and 14C are compared, in the case of using ITSO as the anode, it is understood that higher current efficiency can be obtained and higher internal quantum efficiency can be obtained accordingly when using the silicon nitride oxide or the silicon nitride as the insulating film than when using the silicon oxide as the insulating film.

Although FIGS. 14A to 14C show the case of the anode formed of a single layer of ITSO, it is considered that the internal quantum efficiency of the light-emitting device can be more enhanced by combining the above structure with the structure of the present invention. In other words, when the anode having the conductive light-transmitting oxide layer and the barrier layer; the electroluminescent layer; and the cathode are formed sequentially on the insulating film including the silicon nitride or the silicon nitride oxide, higher internal quantum efficiency can be obtained.

What is claimed is:

1. A method for manufacturing a light-emitting device, comprising the steps of:
    forming a transistor including a semiconductor film;
    forming a first insulating layer over the transistor;
    forming a first electrically conductive film over the first insulating layer, the first electrically conductive film comprising indium oxide and silicon oxide, wherein the first electrically conductive film is a single film;
    removing moisture adsorbed in the first electrically conductive film by performing a heat treatment; and
    forming an electroluminescence layer comprising an organic compound over the first electrically conductive film.

2. A method according to claim 1, further comprising a step of forming a barrier layer on the first electrically conductive film, the barrier layer comprising indium oxide and silicon oxide,
    wherein a concentration of silicon in the barrier layer is higher than a concentration of silicon in the first electrically conductive film.

3. A method according to claim 1, wherein the transistor is a top gate transistor.

4. A method according to claim 1, wherein the semiconductor film comprises a poly-crystalline semiconductor film.

5. A method according to claim 1, wherein the first electrically conductive film further comprises tin.

6. A method according to claim 1, wherein the first electrically conductive film further comprises zinc.

7. A method according to claim 1, wherein the first electrically conductive film is formed by sputtering using a target which comprises indium oxide and silicon oxide.

8. A method for manufacturing a light-emitting device, comprising the steps of:
    forming a transistor including a semiconductor film;
    forming a first insulating layer over the transistor;
    forming a first electrically conductive film over the first insulating layer, the first electrically conductive film comprising indium oxide and silicon oxide, wherein the first electrically conductive film is a single film;
    removing moisture adsorbed in the first electrically conductive film by performing a heat treatment at temperature ranging from 200° C. to 450° C., and
    forming an electroluminescence layer comprising an organic compound over the first electrically conductive film.

9. A method according to claim 8, further comprising a step of forming a barrier layer on the first electrically conductive film, the barrier layer comprising indium oxide and silicon oxide,
   wherein a concentration of silicon in the barrier layer is higher than a concentration of silicon in the first electrically conductive film.

10. A method according to claim 8, wherein the transistor is a top gate transistor.

11. A method according to claim 8, wherein the semiconductor film comprises a poly-crystalline semiconductor film.

12. A method according to claim 8, wherein the heat treatment is performed under vacuum atmosphere.

13. A method according to claim 8, wherein the first electrically conductive film further comprises tin.

14. A method according to claim 8, wherein the first electrically conductive film further comprises zinc.

15. A method according to claim 8, wherein the first electrically conductive film is formed by sputtering using a target which comprises indium oxide and silicon oxide.

16. A method for manufacturing a light-emitting device, comprising the steps of:
   forming a transistor including a semiconductor film;
   forming a first insulating layer over the transistor;
   forming a first electrically conductive film over the first insulating layer, the first electrically conductive film comprising indium oxide and silicon oxide, wherein the first electrically conductive film is a single film;
   forming a partition layer over an edge portion of the first electrically conductive film;
   performing a heat treatment at 200 ° C. to 450 ° C. after forming the partition layer;
   forming an electroluminescence layer comprising an organic compound over the first electrically conductive film; and
   forming a cathode over the electroluminescence layer, the cathode being capable of transmitting light emitted by the electroluminescence layer.

17. A method according to claim 16, further comprising a step of forming a barrier layer on the first electrically conductive film, the barrier layer comprising indium oxide and silicon oxide,
   wherein a concentration of silicon in the barrier layer is higher than a concentration of silicon in the first electrically conductive film.

18. A method according to claim 16, wherein the semiconductor film comprises a poly-crystalline semiconductor film.

19. A method according to claim 16, wherein the first electrically conductive film further comprises tin.

20. A method according to claim 16, wherein the first electrically conductive film is formed by sputtering using a target which comprises indium oxide and silicon oxide.

* * * * *